(12) United States Patent
Yamagata

(10) Patent No.: US 7,393,792 B2
(45) Date of Patent: Jul. 1, 2008

(54) LIGHT-EMITTING DEVICE AND METHOD OF FABRICATING THE SAME

(75) Inventor: Hirokazu Yamagata, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 52 days.

(21) Appl. No.: 11/060,522

(22) Filed: Feb. 17, 2005

(65) Prior Publication Data

US 2005/0156179 A1     Jul. 21, 2005

Related U.S. Application Data

(62) Division of application No. 10/011,195, filed on Dec. 7, 2001, now Pat. No. 6,965,124.

(30) Foreign Application Priority Data

Dec. 12, 2000    (JP)  .............................. 2000-378096

(51) Int. Cl.
    *H01L 21/00*      (2006.01)
(52) U.S. Cl. .......................... 438/717; 438/692; 313/500
(58) Field of Classification Search ................. 438/692, 438/717
See application file for complete search history.

(56) References Cited

U.S. PATENT DOCUMENTS

| | | | |
|---|---|---|---|
| 6,171,961 B1 | 1/2001 | Yamazaki et al. | 438/688 |
| 6,219,113 B1 | 4/2001 | Takahara | 349/42 |
| 6,277,679 B1 | 8/2001 | Ohtani | 438/151 |
| 6,373,453 B1 | 4/2002 | Yudasaka | |
| 6,417,521 B2 | 7/2002 | Inukai | 257/59 |
| 6,420,834 B2 | 7/2002 | Yamazaki et al. | 315/169.3 |
| 6,426,245 B1 | 7/2002 | Kawasaki et al. | 438/166 |
| 6,436,827 B1 | 8/2002 | Yamazaki et al. | 438/688 |
| 6,545,359 B1 * | 4/2003 | Ohtani et al. | 257/758 |

(Continued)

FOREIGN PATENT DOCUMENTS

EP      0 940 796 A1      9/1999

(Continued)

OTHER PUBLICATIONS

Tsutsui, T., et al, "Electroluminescence in Organic Thin Films," Photochemical Processes in Organized Molecular Systems, pp. 437-450, (1991).

(Continued)

*Primary Examiner*—Laura M Schillinger
(74) *Attorney, Agent, or Firm*—Cook, Alex, McFarron, Manzo, Cummings & Mehler, Ltd.

(57) ABSTRACT

A light-emitting device having a structure in which a mask used for forming a film such as an organic compound layer does not come in contact with the pixels in forming the light-emitting elements, and a method of fabricating the same. In fabricating the light-emitting device of the active matrix type, a partitioning wall constituted by a second wiring and a separation portion is formed on the interlayer-insulating film, and the pixels are surrounded by the partitioning wall, preventing the mask from coming into direct contact with the pixels, the mask being used for forming the organic compound layer and the opposing electrode of the light-emitting elements.

9 Claims, 11 Drawing Sheets

U.S. PATENT DOCUMENTS

| | | | |
|---|---|---|---|
| 6,689,492 B1 | 2/2004 | Yamazaki et al. | 428/690 |
| 6,740,938 B2* | 5/2004 | Tsunoda et al. | 257/365 |
| 6,744,217 B2* | 6/2004 | Park | 315/169.3 |
| 6,753,253 B1* | 6/2004 | Takahashi et al. | 438/676 |
| 6,774,969 B2* | 8/2004 | Ma et al. | 349/139 |
| 6,809,021 B2* | 10/2004 | Ohtani et al. | 438/622 |
| 6,853,004 B2 | 2/2005 | Ohtani | |
| 6,861,279 B2* | 3/2005 | Nakanishi et al. | 438/69 |
| 6,906,344 B2* | 6/2005 | Yamazaki et al. | 257/66 |
| 6,953,735 B2* | 10/2005 | Yamazaki et al. | 438/457 |
| 6,965,124 B2* | 11/2005 | Yamagata | 257/79 |
| 7,009,254 B2* | 3/2006 | Nagasawa et al. | 257/355 |
| 7,060,591 B2* | 6/2006 | Yamazaki et al. | 438/457 |
| 7,088,417 B2* | 8/2006 | Kamijima et al. | 349/152 |
| 7,102,231 B2* | 9/2006 | Yamazaki et al. | 257/751 |
| 7,154,119 B2* | 12/2006 | Yamazaki et al. | 257/66 |
| 7,164,155 B2* | 1/2007 | Yamazaki et al. | 257/84 |
| 7,189,654 B2* | 3/2007 | Yamazaki et al. | 438/706 |
| 7,230,601 B2* | 6/2007 | Yamazaki et al. | 345/92 |
| 7,253,441 B2 | 8/2007 | Ohtani | |
| 7,259,110 B2* | 8/2007 | Ohnuma et al. | 438/782 |
| 7,306,978 B2* | 12/2007 | Yamazaki et al. | 438/149 |
| 2002/0070385 A1* | 6/2002 | Yamagata | 257/93 |
| 2002/0075207 A1 | 6/2002 | Yudasaka | |
| 2002/0121860 A1* | 9/2002 | Seo et al. | 313/506 |
| 2002/0149053 A1* | 10/2002 | Tsunoda et al. | 257/347 |
| 2002/0158829 A1* | 10/2002 | Yamazaki et al. | 345/92 |
| 2002/0163611 A1* | 11/2002 | Kamijima et al. | 349/122 |
| 2003/0015703 A1* | 1/2003 | Yamazaki et al. | 257/66 |
| 2003/0077848 A1* | 4/2003 | Ma et al. | 438/30 |
| 2003/0122498 A1* | 7/2003 | Park | 315/169.3 |
| 2003/0132523 A1* | 7/2003 | Ohtani et al. | 257/758 |
| 2003/0134488 A1* | 7/2003 | Yamazaki et al. | 438/455 |
| 2003/0206144 A1 | 11/2003 | Yudasaka | |
| 2004/0004214 A1* | 1/2004 | Yamazaki et al. | 257/40 |
| 2004/0018677 A1* | 1/2004 | Nakanishi et al. | 438/222 |
| 2004/0032637 A1* | 2/2004 | Imamura | 359/245 |
| 2004/0056855 A1* | 3/2004 | Yamazaki et al. | 345/204 |
| 2004/0070721 A1* | 4/2004 | Tsubokura et al. | 349/149 |
| 2004/0145858 A1* | 7/2004 | Sakurada | 361/600 |
| 2005/0011752 A1* | 1/2005 | Yamazaki et al. | 204/192.15 |
| 2005/0040531 A1* | 2/2005 | Kurokawa | 257/756 |
| 2005/0056837 A1* | 3/2005 | Ohtani et al. | 257/57 |
| 2005/0062057 A1* | 3/2005 | Yamazaki et al. | 257/98 |
| 2005/0073243 A1* | 4/2005 | Yamazaki et al. | 313/498 |
| 2005/0156179 A1* | 7/2005 | Yamagata | 257/79 |
| 2005/0164470 A1* | 7/2005 | Yamazaki et al. | 438/455 |
| 2005/0230757 A1* | 10/2005 | Nagasawa et al. | 257/355 |
| 2005/0242713 A1* | 11/2005 | Yamazaki | 313/503 |
| 2005/0245078 A1* | 11/2005 | Ohnuma et al. | 438/672 |
| 2005/0247937 A1* | 11/2005 | Yamazaki et al. | 257/59 |
| 2006/0055314 A1* | 3/2006 | Nakamura et al. | 313/500 |
| 2006/0065897 A1* | 3/2006 | Hirai et al. | 257/72 |
| 2006/0132055 A1* | 6/2006 | Kwak | 315/169.3 |
| 2006/0170077 A1* | 8/2006 | Aoki et al. | 257/642 |
| 2006/0216909 A1* | 9/2006 | Yamazaki et al. | 438/457 |
| 2006/0255345 A1* | 11/2006 | Sakakura et al. | 257/88 |
| 2006/0257796 A1* | 11/2006 | Moriya et al. | 430/322 |
| 2006/0257797 A1* | 11/2006 | Moriya et al. | 430/322 |
| 2006/0267202 A1* | 11/2006 | Matsuzaki | 257/758 |
| 2006/0278875 A1* | 12/2006 | Ohnuma et al. | 257/66 |
| 2007/0001225 A1* | 1/2007 | Ohnuma et al. | 257/347 |
| 2007/0012926 A1* | 1/2007 | Hong et al. | 257/72 |
| 2007/0037069 A1* | 2/2007 | Ohnuma | 430/5 |
| 2007/0037070 A1* | 2/2007 | Ohnuma et al. | 430/5 |
| 2007/0114542 A1* | 5/2007 | Yamazaki et al. | 257/79 |
| 2007/0145372 A1* | 6/2007 | Yamazaki et al. | 257/66 |
| 2007/0167023 A1* | 7/2007 | Yamazaki et al. | 438/717 |

FOREIGN PATENT DOCUMENTS

| | | |
|---|---|---|
| EP | 1 524 696 A2 | 4/2005 |
| JP | 11-65487 | 3/1999 |
| JP | 11-212493 | 8/1999 |
| JP | 11-339968 | 12/1999 |
| JP | 2000-223715 | 8/2000 |
| JP | 2000-252473 | 9/2000 |

OTHER PUBLICATIONS

Baldo, M.A. et al., "Highly Efficient Phosphorescent Emission from Organic Electroluminescent Devices," Nature, vol. 395, pp. 151-154, Sep. 10, 1998.

Baldo, M.A. et al, "Very High-Efficiency Green Organic Light-Emitting Devices Based on Electrophosphorescence," Applied Physics Letters, vol. 75, No. 1, pp. 4-6, Jul. 5, 1999.

Tsutsui, T. et al, "High Quantum Efficiency in Organic Light-Emitting Devices with Iridium-Complex as a Triplet Emissive Center," Japanese Journal of Applied Physics, vol. 38, part 2, No. 12B, pp. L 1502-L 1504, Dec. 15, 1999.

* cited by examiner

FORMATION OF METAL FILM AND SEPARATION FILM

PATTERNING (DRY-ETCHING) THE SEPARATION FILM

ETCHING (WET-ETCHING) THE METAL FILM

SEM PHOTOGRAPH AFTER SiN (DRY-ETCHING)
+ Al (WET-ETCHING) TREATMENT

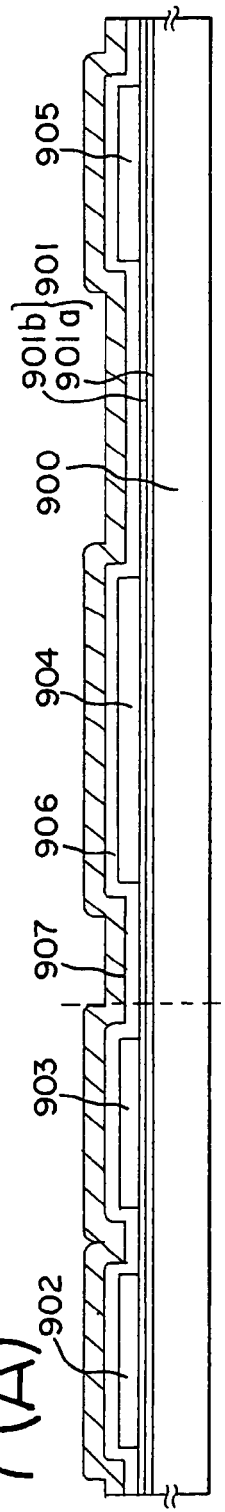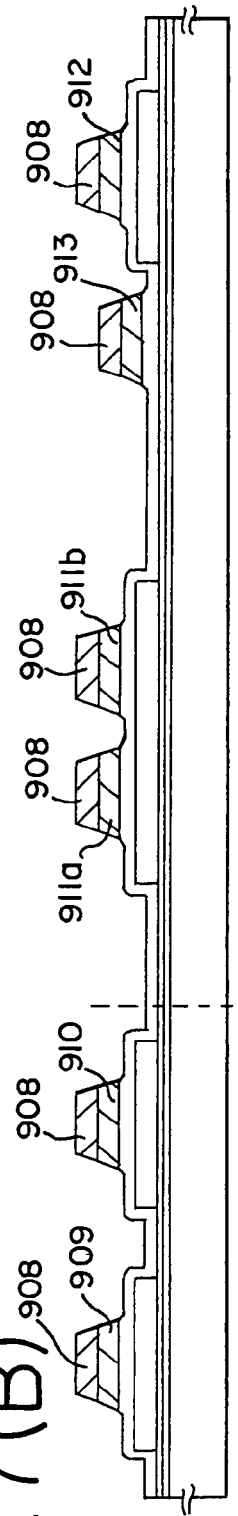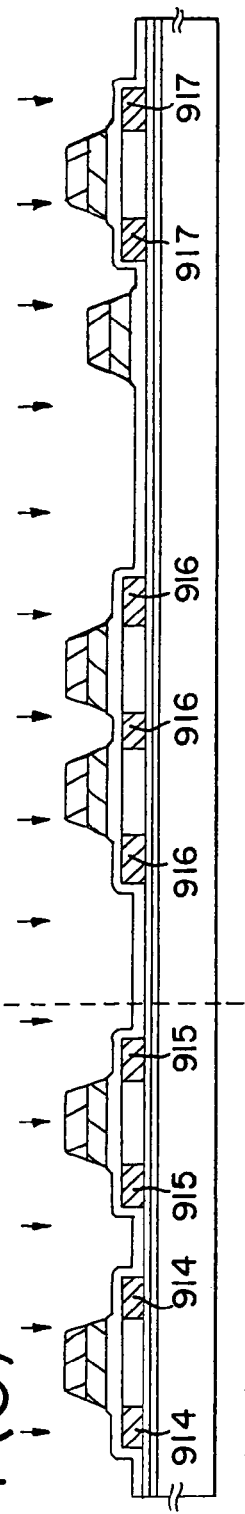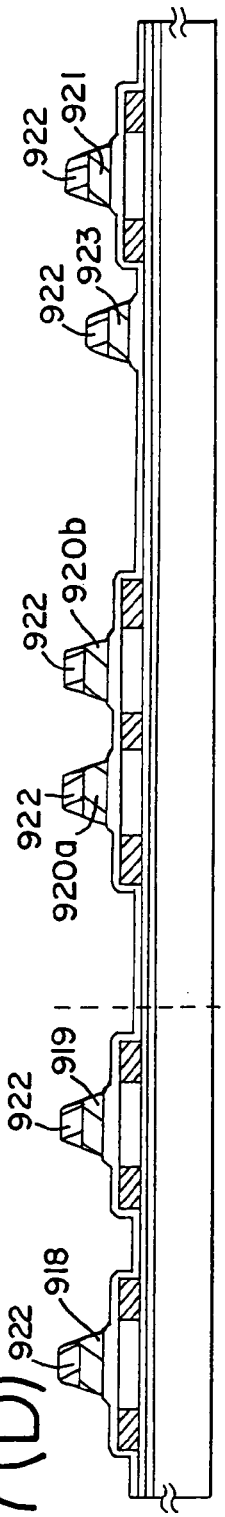

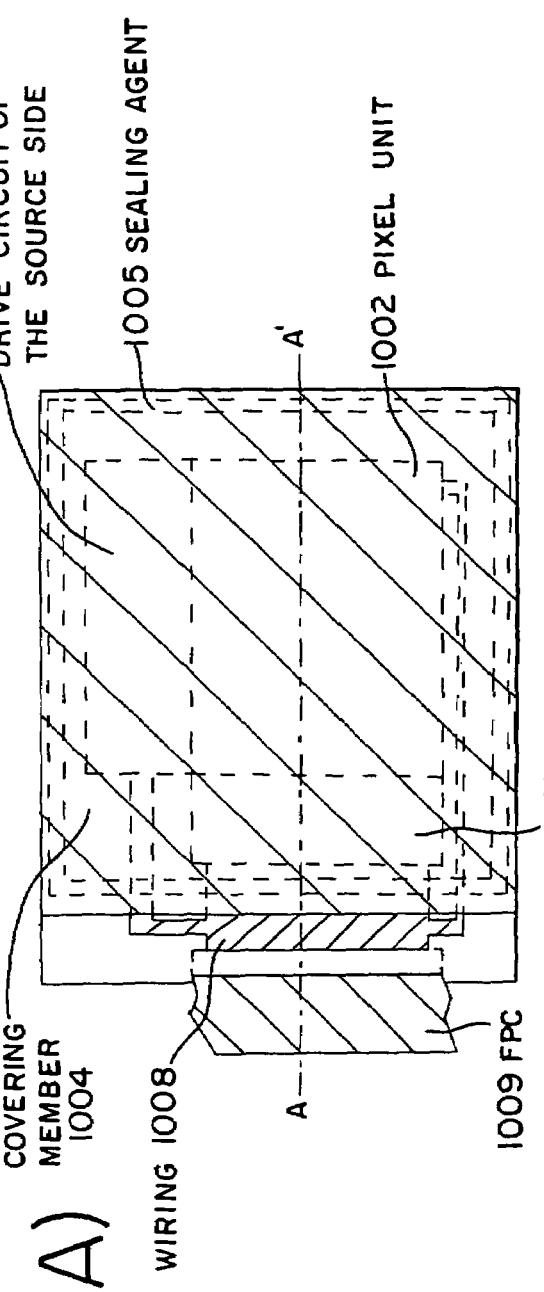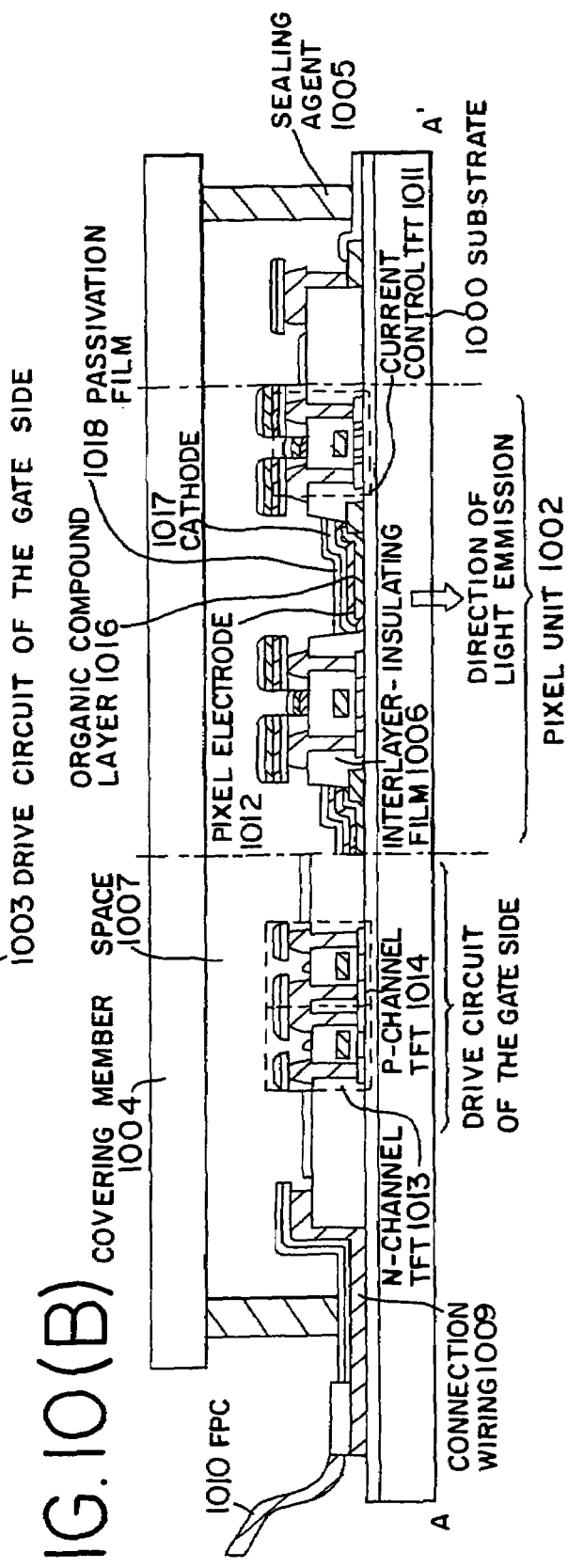

- PIXEL 1107
- CURRENT FEEDER LINE 1106
- SOURCE SIGNAL LINE 1105
- INTERLAYER INSULATING FILM 1108

- CATHODE 1109
- CONNECTION WIRING 1110 TO EXTERNAL POWER SOURCE

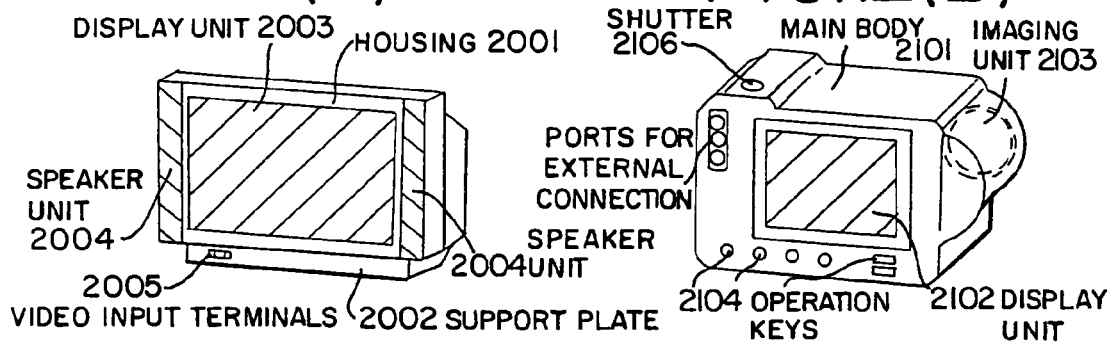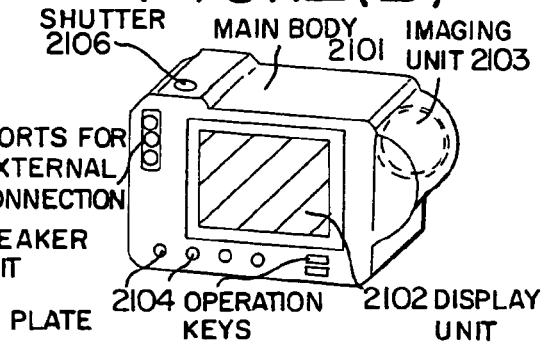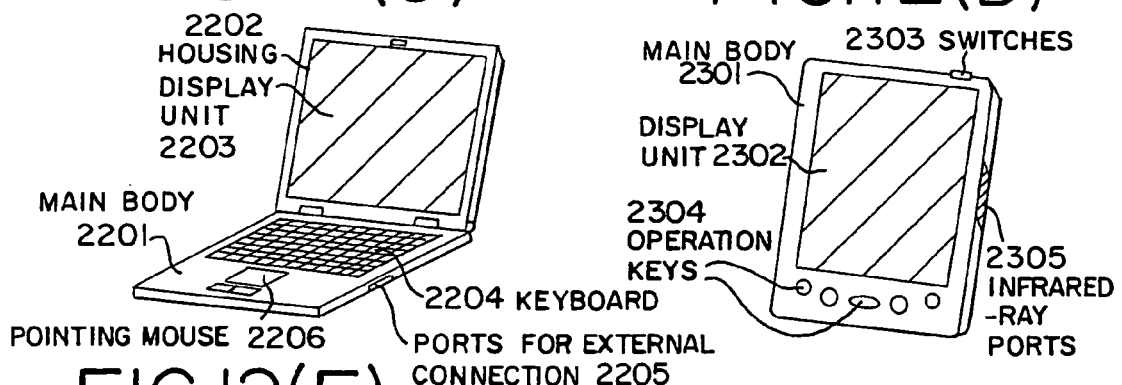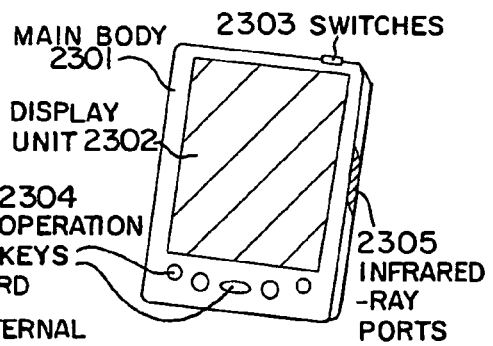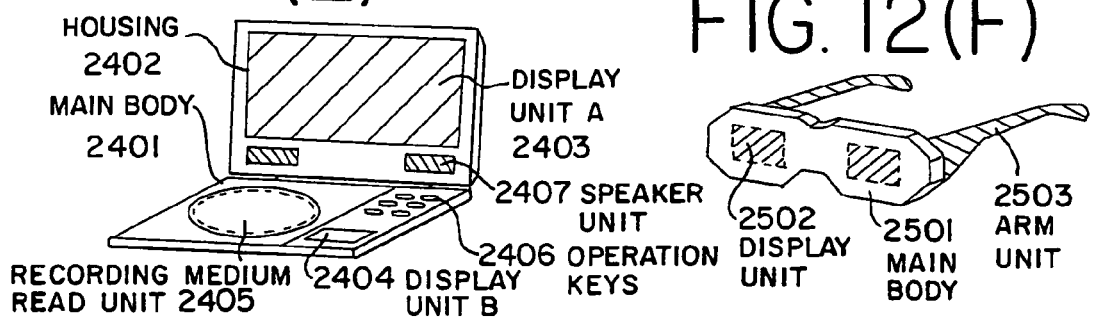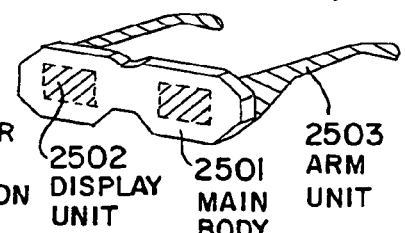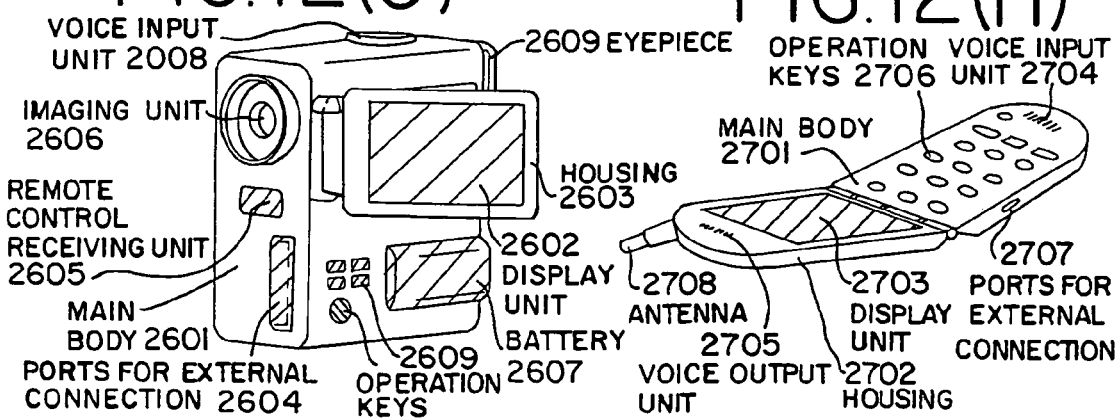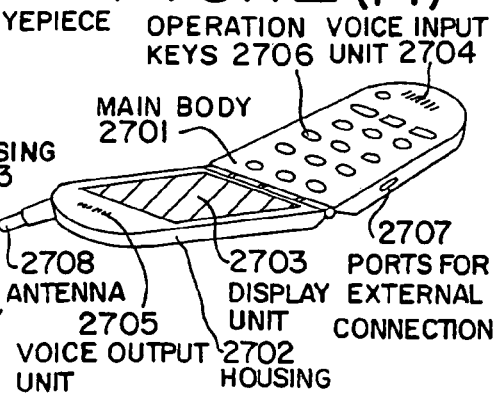

LIGHT-EMITTING DEVICE AND METHOD OF FABRICATING THE SAME

This application is a divisional of U.S. application Ser. No. 10/011,195, filed on Dec. 7, 2001.

BACKGROUND OF THE INVENTION

1. Field of the Invention

The present invention relates to a method of fabricating an active matrix-type light-emitting device having a light-emitting element on a substrate, and to a light-emitting device. The light-emitting element stands for an element of a structure having an anode, a cathode and an organic compound layer containing a light-emitting organic material (hereinafter referred to as organic material) that produces EL (electroluminescence) sandwiched therebetween. The light-emitting element referred to here is also called OLED (organic light-emitting device). In this specification, further, a light-emitting panel having a light-emitting element sealed between a substrate and a covering member, and a light-emitting module having an IC mounted on the light-emitting panel, are generally referred to as light-emitting devices. The invention is further concerned with electric appliances using the above light-emitting device on the display unit. The EL (electroluminescent) devices referred to in this specification include triplet-based light emission devices and/or singlet-based light emission devices, for example.

2. Prior Art

The light-emitting element is highly visible since it emits light by itself, is best suited for decreasing the thickness since it does not use backlight needed by the liquid crystal display devices (LCDs), and imposes no limitation on the viewing angle. In recent years, therefore, the light-emitting device using the light-emitting element is drawing attention to substitute for the CRTs and LCDs.

The light-emitting element includes a layer containing an organic material that produces EL (electroluminescence: luminescence which is produced upon the application of a electric field), an anode and a cathode. The luminescence produced by the organic material can be classified into emission of light (fluorescence) of when the singlet excitation state returns back to the ground state and emission of light (phosphorescence) of when the triplet excitation state returns back to the ground state. The light-emitting device of the present invention may use the light-emitting element containing either organic material.

In this specification, the layers provided between the anode and the cathode are all defined as organic compound layers. Concretely speaking, the organic compound layers include a light-emitting layer, a positive hole injection layer, an electron injection layer, a positive hole transporting layer and an electron transporting layer. Basically, the light-emitting element has a structure in which the anode/light-emitting layer/cathode are laminated in this order. In addition to this structure, the light-emitting element may often have a structure in which the anode/positive hole injection layer/light-emitting layer/cathode are laminated in this order or the anode/positive hole injection layer/light-emitting layer/electron transporting layer/cathode are laminated in this order.

In forming the light-emitting element, the layer of the organic compound is formed by the vaporization method, printing method, ink-jet method or spin-coating method.

Among them, the vaporization method capable of separately applying the organic compound by using a metal mask or the like mask, is one of the film-forming methods frequently used for forming a film of a low-molecular organic material. In forming the active matrix-type light-emitting element, however, this method arouses a problem in that the pixels are damaged when the metal mask comes in contact with the pixels in forming the film of the organic compound, since the light-emitting elements are formed after the TFTs are formed.

According to the conventional method of fabricating the light-emitting element as taught in Japanese Patent Laid-Open No. 339968/1999, however, the passivation film is formed after the pixel electrode is formed, and the organic compound layer and the opposing electrode are formed after the passivation film is removed from the pixel electrode portion. Therefore, there has been formed a structure for protection with the passivation film so that the metal mask will not come in contact with the pixels. In this specification, the passivation film formed except on the pixel electrodes is called bank.

By forming the bank prior to forming the layer of the organic compound and the opposing electrodes as described above, it is allowed to prevent the metal mask from coming into contact with the pixels.

In fabricating the light-emitting element, the bank comprising an insulating material is formed to surround the pixels after the pixel electrode is formed for each of the pixels.

The bank works not only to protect the wiring but also to protect the pixel electrodes of the pixels, the organic compound layer and the opposing electrodes from being damaged when they are touched by the metal mask in forming the organic compound layer and the opposing electrodes by vaporization on the pixel electrodes of the pixels by using the metal mask, and to prevent the electrodes from being short-circuited to the wiring at the time when the opposing electrodes are formed.

However, formation of the bank requires another piece of mask for patterning.

SUMMARY OF THE INVENTION

It is therefore an object of this invention to provide a method of fabricating an active matrix-type light-emitting device without the bank but which is provided with a function that substitutes for the bank, and a light-emitting device fabricated by this method.

This invention was accomplished in order to solve the above-mentioned problem, and provides a method of fabricating an active matrix-type light-emitting device, wherein a structure for protecting the surroundings of pixels is formed by using an interlayer-insulating film and a wiring formed on the interlayer-insulating film, in order to prevent a metal mask from coming into direct contact with the pixels in forming the light-emitting elements in the pixels.

Formation of the above structure makes it possible to control the positions for forming the organic compound layer on the pixel electrodes and for forming the film on the opposing electrodes, so that the electrodes forming the light-emitting elements will not be short-circuited.

First, a TFT is formed on a substrate. In forming a gate electrode of the TFT, there is simultaneously formed a first wiring on a portion of the region where the light-emitting element is to be formed to connect the TFT to a pixel electrode. In this specification, the first wiring is called electrode connection wiring. There is, then, formed an interlayer-insulating film of an insulating material. Upon partly etching the interlayer-insulating film, the interlayer-insulating film is also etched from a portion where a pixel is to be formed, and the electrode connection wiring that has been formed is partly exposed.

Then, a metal film and an insulating film are formed. First, the insulating film is patterned by dry etching. At this moment, the metal film and the insulating film provide sufficiently large selection ratios. Next, the metal film is patterned by wet etching thereby to form a separation portion and a wiring (second wiring) from the insulating film and the metal film. In etching the metal film, the separation portion is simultaneously etched, too. Here, however, the material forming the second wiring has been so selected as to be etched faster with an etching solution than the material forming the separation portion. If the substrate on which the TFT is formed after the second wiring has been formed, is viewed from the upper side, therefore, the second wiring is formed having an area smaller than that of the separation portion. The etching solution used for the wet etching may be a hydrofluoric acid or a mixed solution containing the hydrofluoric acid, or a mixed solution of phosphoric acid, nitric acid and acetic acid.

The second wiring is so formed as to be electrically connected to the source or the drain of the TFT. The second wiring is further so formed as to be overlapped on the interlayer-insulating film and on part of the electrode connection wiring.

The wiring and the separation portion are thus formed on the interlayer-insulating film. In this specification, the second wiring and the separation portion formed on the interlayer-insulating film are called partitioning walls. In the foregoing was described the case where different etching methods were used for forming the separation portion and the second wiring, which, however, may be formed by the same wet-etching method. A current control TFT for controlling the amount of current flowing into the light-emitting element is in contact with the electrode connection wiring and is electrically connected thereto.

After the partitioning walls have been formed, a pixel electrode is formed for each of the pixels so as to be in contact with the electrode connection wiring in a portion that is not overlapped on the second wiring. The pixel electrode formed here is not in contact with the second wiring. An organic compound layer is deposited on the pixel electrode by the vaporization method by using a metal mask.

Here, the metal mask may be so provided as will not come in contact with the substrate. Even when the metal mask is brought into contact with the substrate, however, the pixels are not damaged. Due to the metal mask and the partitioning wall, it is allowed to form the organic compound layer at any desired position maintaining good precision.

Next, an opposing electrode is formed. Here, the electrode is formed with the partitioning walls as a mask, and is not short-circuited to the pixel electrode or the wiring.

As described above, the bank is formed requiring no mask. Further, the light-emitting element is not deteriorated with water that is produced at the time when the bank is formed using a resin, and the pixel electrode is not affected by the temperature at the time when the bank is fired. It is further allowed to form a structure in which the pixels are surrounded by the interlayer-insulating film.

BRIEF DESCRIPTION OF THE DRAWINGS

FIGS. 7(A) to 7(D) are views illustrating the steps of fabrication;

FIGS. 10(A) and 10(B) are views illustrating a structure for sealing a light-emitting device;

FIGS. 12(A) to 12(H) are views illustrating examples of electric appliances.

DESCRIPTION OF THE PREFERRED EMBODIMENTS

Figure 1A:
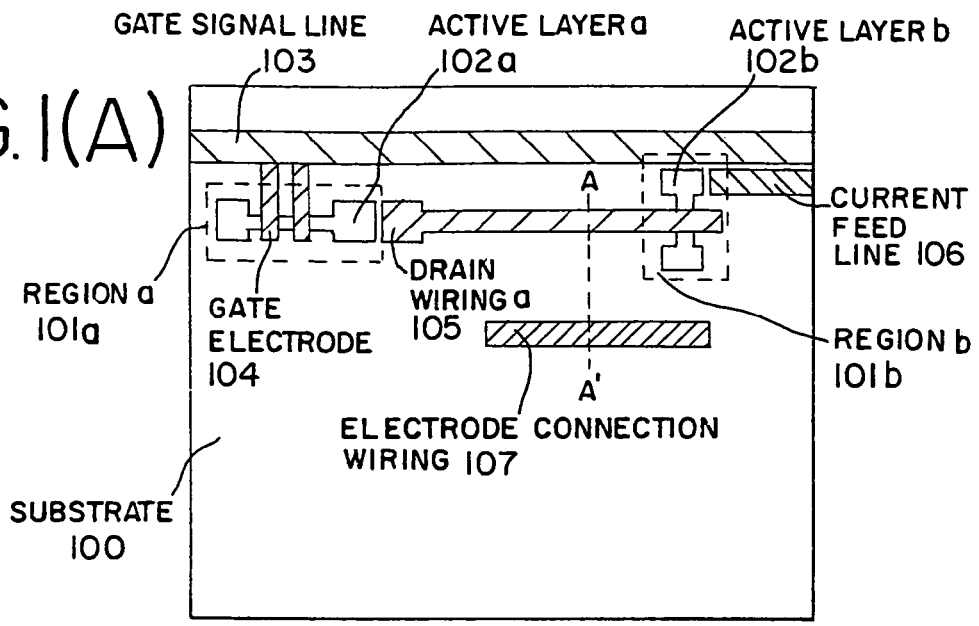
FIGS. 1(A) to 1(C) are views illustrating a method of fabrication according to this invention.

An embodiment of the invention will now be described with reference to FIGS. 1 and 2. FIG. 1(A) illustrates a pixel which is formed in a plural number in a pixel unit.

First, an active layer of Si is formed on a substrate 100. This forms a source region, a drain region and a channel region of the TFT that will be fabricated later. Here, regions surrounded by dotted lines in FIG. 1(A) are called region a (101a) and region b (101b). A TFT formed in the region a (101a) serves as a switching TFT, and a TFT formed in the region b (101b) serves as a current control TFT. That is, an active layer a (102a) forms a source region, a drain region and a channel region of the switching TFT. Further, an active layer b (102b) forms a source region, a drain region and a channel region of the current control TFT.

Reference numeral 103 denotes a gate signal line, and a wiring 104 connected to the gate signal line forms a gate electrode of the switching TFT that will be formed later. Described here is a case where the device has a double gate structure. The gate structure, however, is in no way limited thereto only but may be a single-gate structure or a multiple-gate structure.

There is further formed, simultaneously with the above wirings, a drain wiring a (105) which is electrically connected to the drain of the switching TFT. The drain wiring a (105) serves as a gate electrode of the current control TFT. There is further formed a current feeder line 106 that forms an electric connection to the current control TFT. The current feeder line 106 feeds an electric current that flows into the light-emitting element.

Reference numeral 107 denotes an electrode connection wiring that electrically connects the current control TFT and the pixel electrode together.

After these wirings are formed, an interlayer-insulating film 108 is formed. An insulating material is used for forming the interlayer-insulating film 108. Concretely speaking, there may be used an inorganic film containing silicon, such as silicon oxide or silicon nitride, or an organic resin film such as of polyimide, polyamide or acrylic resin.

Figure 1B:
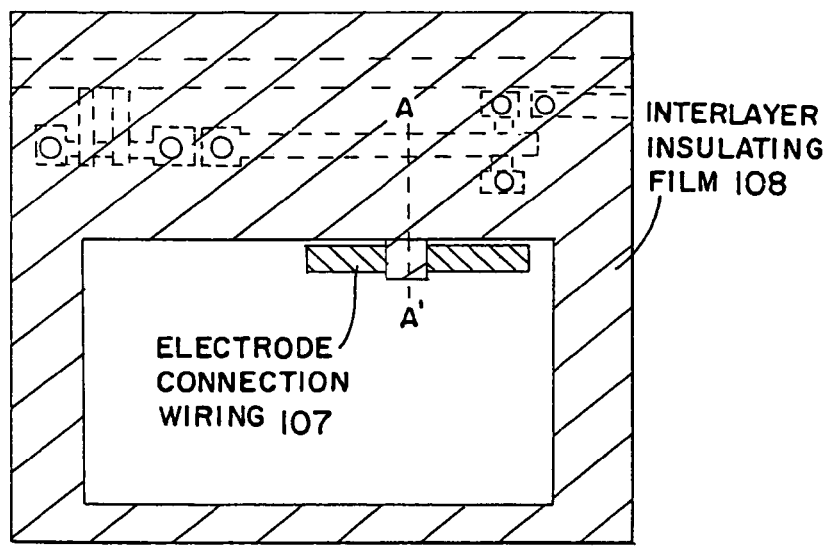

After the interlayer-insulating film 108 is formed, the region for forming the pixel electrode is patterned into a shape as shown in FIG. 1(B). Here, as shown, the interlayer-insulating film has been formed to partly cover the electrode wiring 107.

Figure 1C:
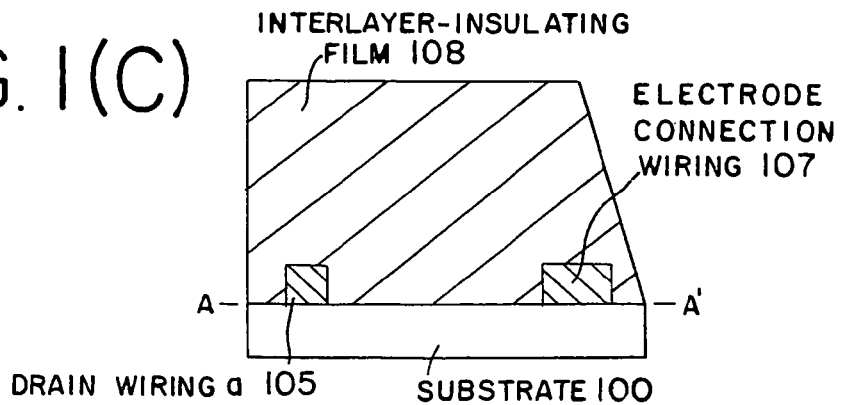

FIG. 1(C) is a sectional view of a portion along a dotted line AA' in FIG. 1(B). Namely, in this portion, the wirings are all covered with the interlayer-insulating film 108.

Figure 2A:
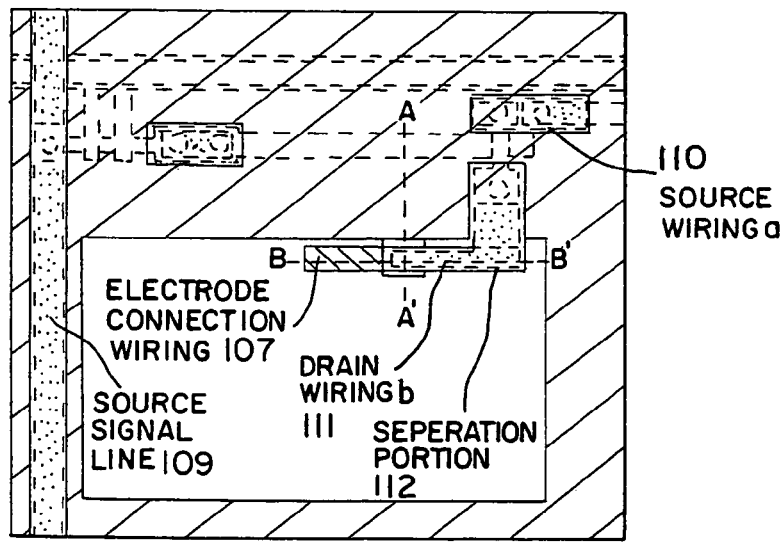
FIGS. 2(A) to 2(C) are views illustrating a method of fabrication according to this invention.

Next, in addition to a source signal line 109, there are formed a source wiring a (110) for electrically connecting the current control TFT to the current feeder line 106, and a drain wiring b (111) for electrically connecting the drain of the current control TFT to the electrode connection wiring 107 (FIG. 2(A)).

These wirings are formed by forming the structure shown in FIG. 1(B) and, then, forming a film of a metal material for forming the wirings. The metal material used here may be Al (aluminum) or Ti (titanium), or an alloy of Al and Ti, or an alloy of Al and Si.

On the metal film is further formed a separation film by using a material which provides a selection ratio with the etching solution when it is etched simultaneously with the metal film by the wet-etching method. As described above, the separation film may be formed using any material provided it exhibits a selection ratio to the metal film at the time of wet etching. Therefore, the separation film may be an inorganic film such as of silicon nitride or silicon oxide, or may be a metal film such as of Ti. There may be further used an organic resin such as polyimide, polyamide, acrylic resin or resist.

A wiring pattern is formed after the metal film and the separation film are formed. Dry etching is effected after the separation film is patterned, thereby to form a wiring pattern of the metal film and the separation film laminated one upon the other. The wiring is wet-etched to etch the metal film having a larger selection ratio of etching. When viewed from the upper side, therefore, the metal film becomes smaller than the separation film as shown in FIG. 2(A).

Figure 2B:
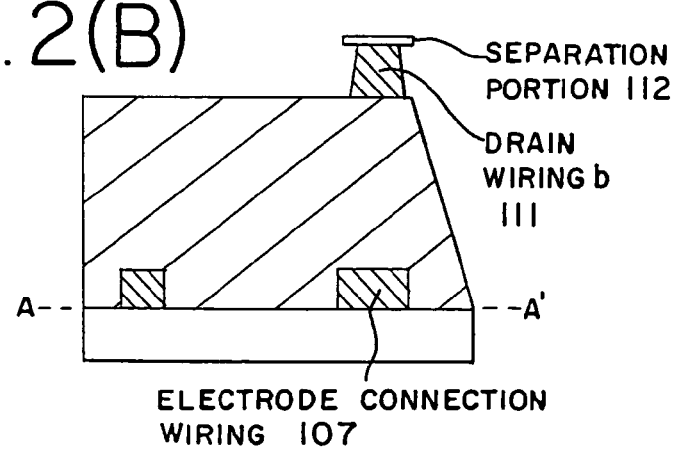

Here, a portion along the dotted line AA' in FIG. 2(A) is patterned, i.e., the metal film is patterned to form a drain wiring b (111). FIG. 2(B) is a sectional view of a separation portion 112 formed by etching the separation film. In this specification, the separation films formed on the wiring by patterning are all called separation portions. FIG. 2(B) illustrates a state where the separation portion 112 is formed on the drain wiring b (111). In this invention, however, the wirings formed by patterning the separation film all have their upper portions covered with the separation portion.

Figure 2C:
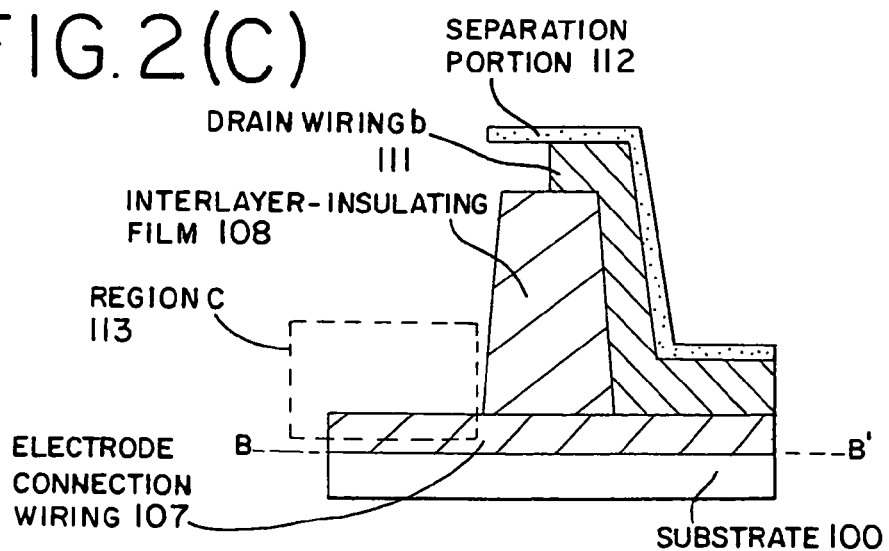

FIG. 2(C) is a sectional view of a portion along a dotted line BB' in FIG. 2(A). As will be understood from the sectional view of FIG. 2(C), the electrode connection wiring 107 is formed being partly connected to the drain wiring b (111) and is, hence, electrically connected thereto.

In a region (113) shown in FIG. 2(C), the pixel electrode for forming the light-emitting element is patterned, and an organic compound layer and an opposing electrode are formed thereon by vaporization by using a metal mask. Here, due to the partitioning wall formed by the drain wiring b (111) and the separation portion 112, it is allowed to prevent the pixel from coming in contact with the metal mask. It is further made possible to solve the problem of short-circuit between the pixel electrode and the opposing electrode caused by the positions for forming the organic compound layer and the opposing electrode.

Further, since the drain wiring b (111) has its upper part completely covered with the separation portion 112, the problem of short-circuit between the drain wiring b (111) and the opposing electrode is prevented at the time when the opposing electrode is formed for forming the light-emitting element.

Upon putting the invention into practice as described above, the wiring can be used to substitute for the conventional bank. Therefore, no mask needs to be used for forming the bank, and the process of fabrication can be simplified.

Described below are the method of forming the wiring and the separation portion by etching described above, and the shapes thereof.

Figure 3A:
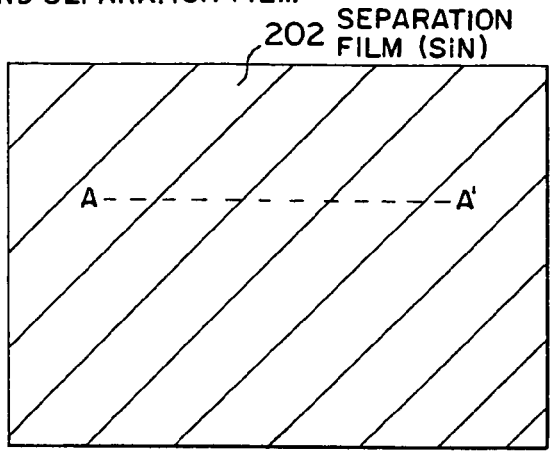
FIGS. 3(A) to 3(C) are views illustrating how to form partitioning walls.
Figure 3A:
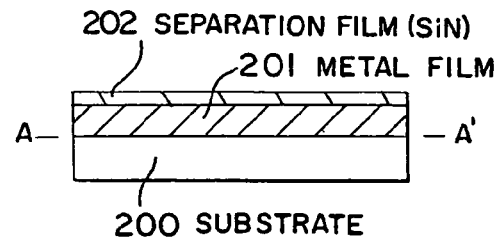

Referring to FIG. 3(A), a metal film 201 is formed on a substrate 200, and a separation film 202 is formed on the metal film 201. FIG. 3(a) is a sectional view along a dotted line AA' in FIG. 3(A).

Figure 3B:
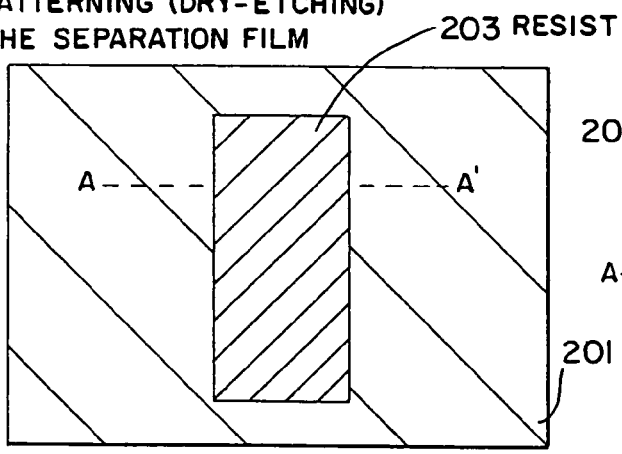
Figure 3B:
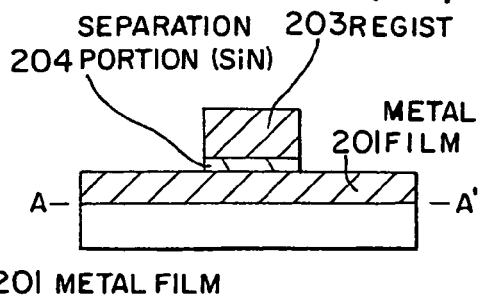

The separation film 202 is patterned by dry etching by using a resist 203 to form a separation portion 204 having a desired pattern as shown in FIG. 3(B).

FIG. 3(b) illustrates the sectional structure along a dotted line AA' in FIG. 3(B).

Here, the metal film 201 is etched by wet etching. At this moment, the material forming the separation portion 204 and the material forming the metal film 201 must be those that are capable of providing a sufficient degree of selection ratio for the etching solution during the etching.

Figure 3C:
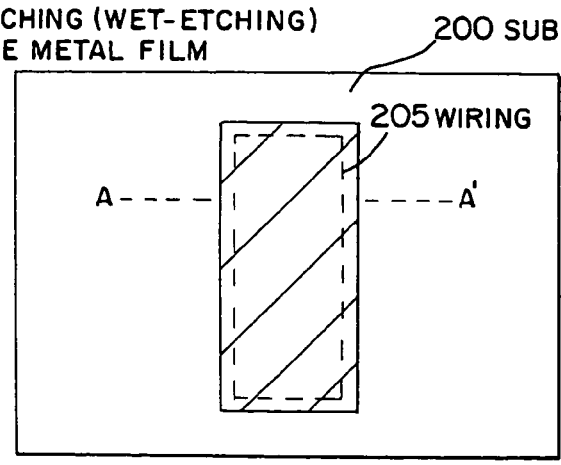
Figure 3C:
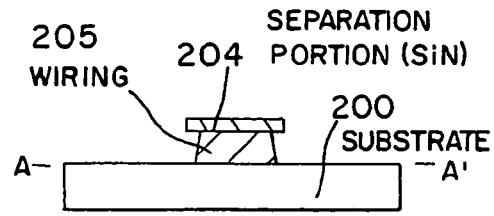

Here, the metal film 201 is etched to form a separation portion 204 and a wiring 205 as shown in FIG. 3(C). FIG. 3(c) shows the sectional structure along a dotted line AA' in FIG. 3(C).

Figure 4A:
FIG. 4(A) is an SEM photograph of the partitioning walls.

FIG. 4(A) is an SEM photograph of the sectional structures of the separation portion 204 and the wiring 205 formed by the above method by using Al as the metal film 201 and SiN as the separation portion 204.

Figure 4B:
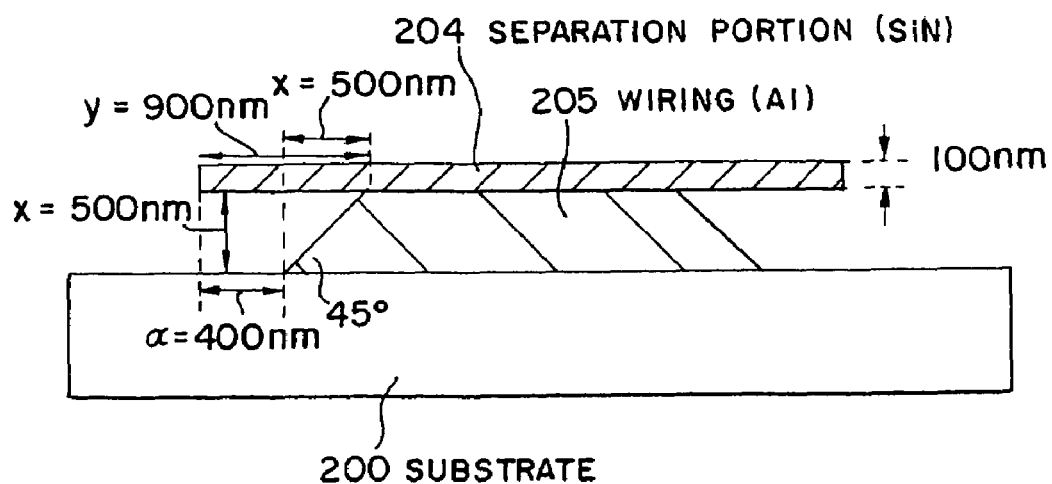
FIG. 4(B) shows details of a structure shown in the SEM photograph of FIG. 4(A)

FIG. 4(B) illustrates in detail the structure shown in the SEM photograph of FIG. 4(A). Reference numerals used here are corresponding to reference numerals used in FIG. 3.

Here, the etching is isotropic in which a thickness (x) of the wiring, an etching distance (y) of the upper part of the wiring in the transverse direction with the etching center (c) as a reference, and an etching distance (a) of a lower part of the wiring in the transverse direction with the etching center (c) as a reference, satisfy a relationship $y=x+\alpha$ ($\alpha>0$). In the case of this embodiment, the thickness x of the wiring is 500 nm, the etching distance a of the lower part of the wiring in the transverse direction is 400 nm, and the etching distance y of the upper part of the wiring in the transverse direction is 900 nm. Not being limited thereto only according to this invention, further, the wiring material, the width of wiring and the etching rate may be suitably adjusted such that the above relationship holds true.

EXAMPLES

Example 1

This Example deals with the structure of a pixel unit of a light-emitting device fabricated according to this invention.

Figure 5:
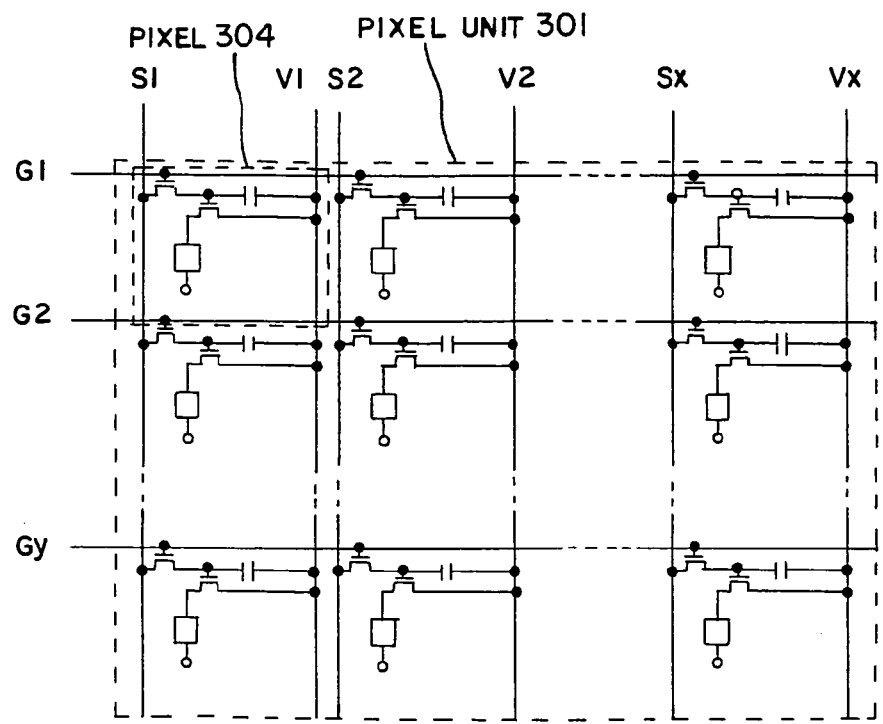
FIG. 5 is a circuit diagram of pixels.

FIG. 5 is a diagram illustrating, on an enlarged scale, a pixel unit 301 of the light-emitting device. The pixel unit 301 is provided with source signal lines (S1 to Sx), current feeder lines (V1 to Vx) and gate signal lines (G1 to Gy).

In the case of this Example, a pixel 304 is a region having any one of the source signal lines (S1 to Sx), any one of the current feeder lines (V1 to Vx) and any one of the gate signal lines (G1 to Gy). The pixel unit 301 includes plural pixels 304 arranged in the form of a matrix.

Figure 6:
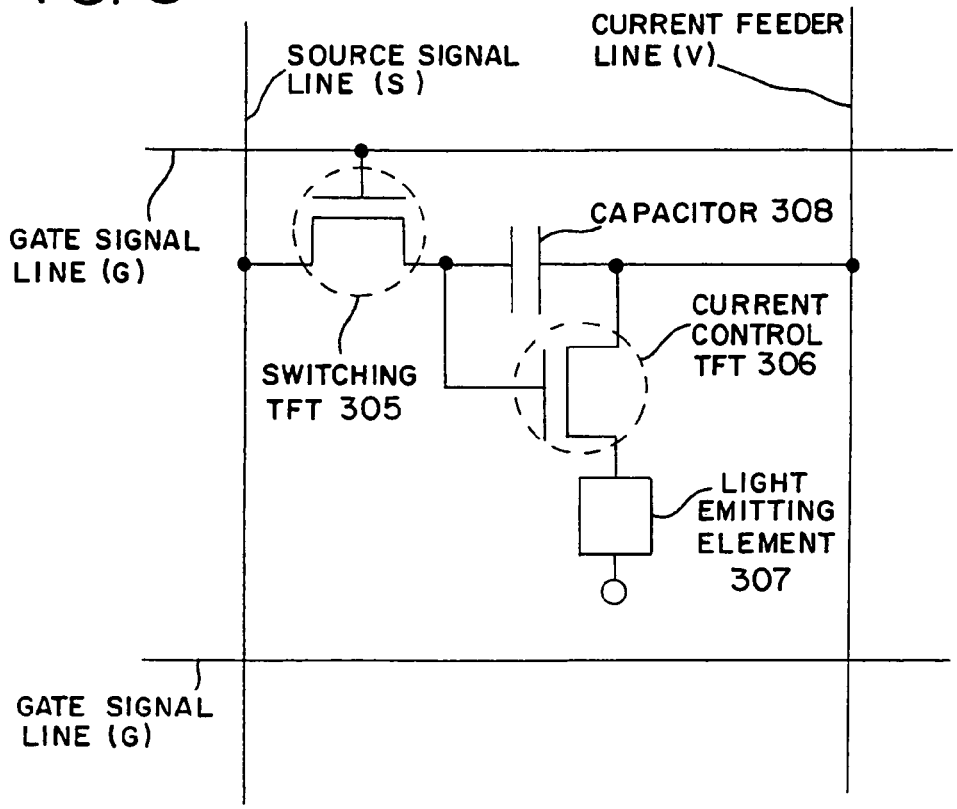
FIG. 6 is a circuit diagram of a pixel.

Referring to FIG. 6 illustrating the pixel 304 on an enlarged scale, reference numeral 305 denotes a switching TFT. The gate electrode of the switching TFT 305 is connected to the gate signal line G (G1 to Gx). The switching TFT 305 has the source region and the drain region, the one of which being connected to the source signal line S (S1 to Sx) and the other one of which being connected to the gate electrode of a current control TFT 306 and to a capacitor 308 possessed by each pixel.

The capacitor 308 is for holding the gate voltage (potential difference between the gate electrode and the source region) of the current control TFT 306 when the switching TFT 305 is in the non-selected state (off state). This Example illustrates the constitution provided with the capacitor 308. Being not limited to this constitution only, however, the invention may not be provided with the capacitor 308.

The current control TFT 306 includes the source region and the drain region, the one of which being connected to the current feeder line V (V1 to Vx) and the other one of which being connected to a light-emitting element 307. The current feeder line V is connected to the capacitor 308.

The light-emitting element 307 includes an anode, a cathode and an organic compound layer provided between the anode and the cathode. When the anode is connected to the source region or the drain region of the current control TFT 306, the anode serves as the pixel electrode and the cathode serves as the opposing electrode. Conversely, when the cathode is connected to the source region or to the drain region of the current control TFT 306, the cathode serves as the pixel electrode and the anode serves as the opposing electrode.

An opposing potential is applied to the opposing electrode of the light-emitting element 307. A power source potential is applied to the current feeder line V. The power source potential and the opposing potential are given from a power source such as of an IC provided outside the light-emitting device of the invention.

The switching TFT 305 and the current control TFT 306 may be either the n-channel TFTs or the p-channel TFTs. Here, however, when either the source region or the drain region of the current control TFT 306 is connected to the anode of the light-emitting element 307, it is desired that the current control TFT 306 is the p-channel TFT. Further, when either the source region or the drain region of the current control TFT 306 is connected to the cathode of the light-emitting element 307, it is desired that the current control TFT 306 is the n-channel TFT.

Further, the switching TFT 305 and the current control TFT 306 may have a multi-gate structure such as a double-gate structure or a triple-gate structure instead of the single-gate structure.

Figure 8A:
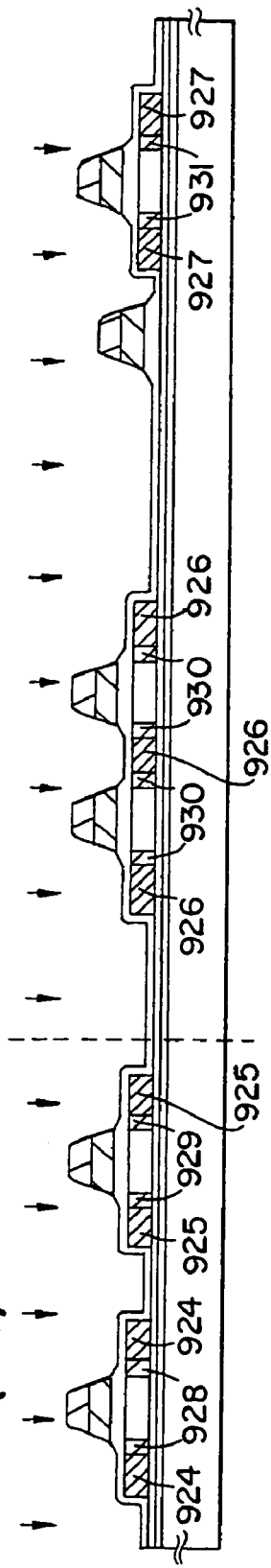
FIGS. 8(A) to 8(C) are views illustrating the steps of fabrication.
Figure 8B:
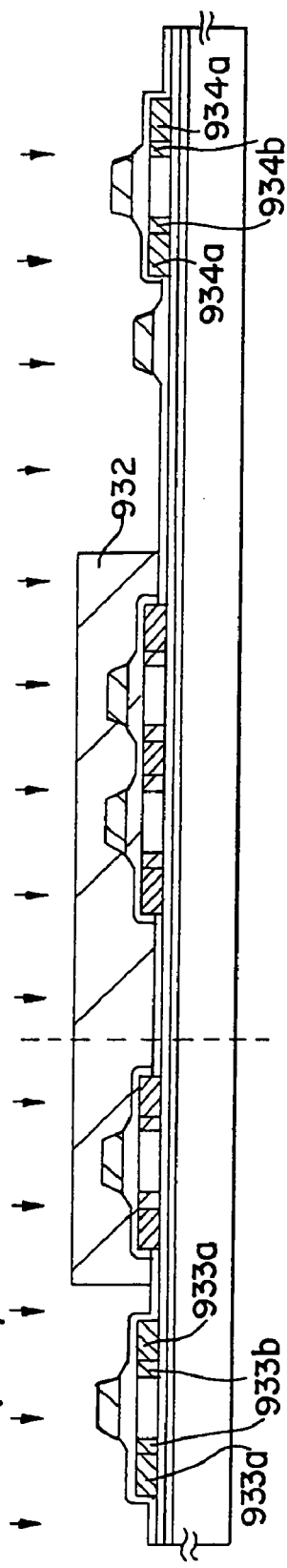
Figure 8C:
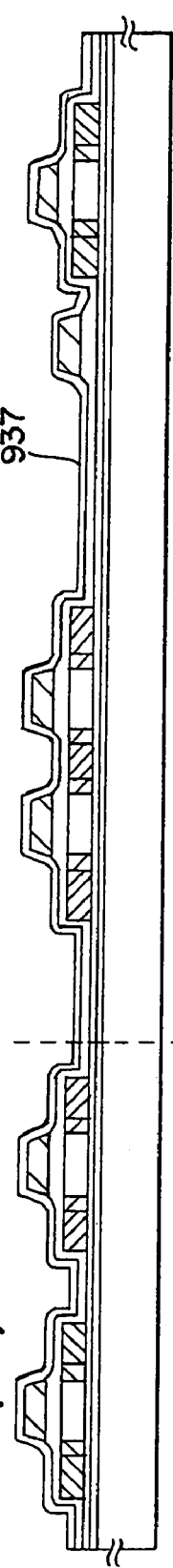
Figure 9A:
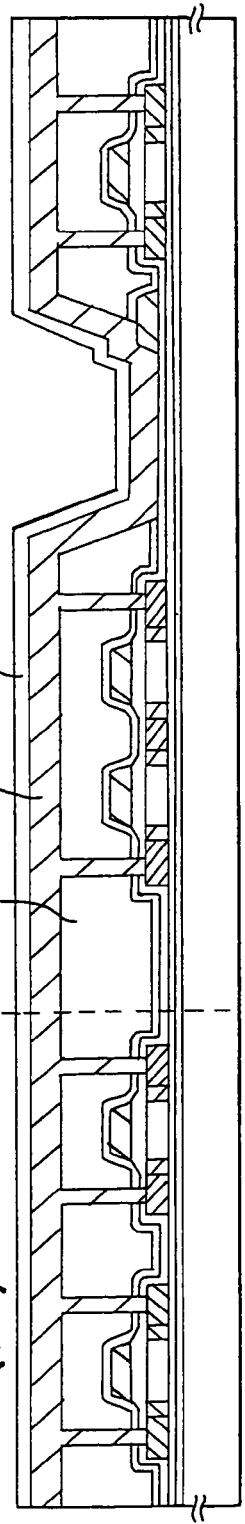
FIGS. 9(A) to 9(C) are views illustrating the steps of fabrication.

Next, described with reference to FIGS. 7 to 9 is a method of simultaneously forming, on the same substrate, the pixel unit described above and the TFTs (n-channel TFTs and p-channel TFTs) of a drive circuit provided surrounding the pixel unit.

This Example uses a substrate 900 of a glass such as barium borosilicate glass or aluminoborosilicate glass as represented by the glass #7059 or the glass #1737 of Corning Co. There is no limitation on the substrate 900 provided it has a property of transmitting light, and there may be used a quartz substrate. There may be further used a plastic substrate having heat resistance capable of withstanding the treatment temperature of this Example.

Referring next to FIG. 7(A), an underlying film 901 comprising an insulating film such as silicon oxide film, silicon nitride film or silicon oxynitride film is formed on the substrate 900. In this Example, the underlying film 901 has a two-layer structure. There, however, may be employed a structure in which a single layer or two or more layers are laminated on the insulating film. The first layer of the underlying film 901 is a silicon oxynitride film 901a formed maintaining a thickness of from 10 to 200 nm (preferably, from 50 to 100 nm) relying upon a plasma CVD method by using $SiH_4$, $NH_3$ and $N_2O$ as reaction gases. In this Example, the silicon oxynitride film 901a (having a composition ratio of Si=32%, O=27%, N=24%, H=17%) is formed maintaining a thickness of 50 nm. The second layer of the underlying film 901 is a silicon oxynitride film 901b formed maintaining a thickness of from 50 to 200 nm (preferably, from 100 to 150 nm) relying upon the plasma CVD method by using $SiH_4$ and $N_2O$ as reaction gases. In this Example, the silicon oxynitride film 901b (having a composition ratio of Si=32%, O=59%, N=7%, H=2%) is formed maintaining a thickness of 100 nm.

Then, semiconductor layers 902 to 905 are formed on the underlying film 901. The semiconductor layers 902 to 905 are formed by forming a semiconductor film having an amorphous structure by a known means (sputtering method, LPCVD method or plasma CVD method) followed by a known crystallization processing (laser crystallization method, heat crystallization method or heat crystallization method using a catalyst such as nickel), and patterning the crystalline semiconductor film thus obtained into a desired shape. The semiconductor layers 902 to 905 are formed in a thickness of from 25 to 80 nm (preferably, from 30 to 60 nm). Though there is no limitation on the material of the crystalline semiconductor film, there is preferably used silicon or a silicon-germanium ($Si_xGe_{1-x}$ (X=0.0001 to 0.02)) alloy. In this Example, the amorphous silicon film is formed maintaining a thickness of 55 nm relying on the plasma CVD method and, then, a solution containing nickel is held on the amorphous silicon film. The amorphous silicon film is dehydrogenated (500° C., one hour), heat-crystallized (550° C., 4 hours) and is, further, subjected to the laser annealing to improve the crystallization, thereby to form a crystalline silicon film. The crystalline silicon film is patterned by the photolithographic method to form semiconductor layers 902 to 905.

The semiconductor layers 902 to 905 that have been formed may further be doped with trace amounts of an impurity element (boron or phosphorus) to control the threshold value of the TFT.

In forming the crystalline semiconductor film by the laser crystallization method, further, there may be employed an excimer laser of the pulse oscillation type or of the continuously light-emitting type, a YAG laser or a $YVO_4$ laser. When these lasers are to be used, it is desired that a laser beam emitted from a laser oscillator is focused into a line through an optical system so as to fall on the semiconductor film. The conditions for crystallization are suitably selected by a person who carries out the process. When the excimer laser is used, the pulse oscillation frequency is set to be 300 Hz and the laser energy density to be from 100 to 400 mJ/cm$^2$ (typically, from 200 to 300 mJ/cm$^2$). When the YAG laser is used, the pulse oscillation frequency is set to be from 30 to 300 kHz by utilizing the second harmonics and the laser energy density to be from 300 to 600 mJ/cm$^2$ (typically, from 350 to 500 mJ/cm$^2$). The whole surface of the substrate is irradiated with the laser beam focused into a line of a width of 100 to 1000 μm, for Example, 400 μm, and the overlapping ratio of the linear beam at this moment is set to be 50 to 90%.

Then, a gate-insulating film 906 is formed to cover the semiconductor layers 902 to 905. The gate-insulating film 906 is formed of an insulating film containing silicon maintaining a thickness of from 40 to 150 nm by the plasma CVD method or the sputtering method. In this Example, the gate-insulating film is formed of a silicon oxynitride film (composition ratio of Si=32%, O=59%, N=7%, H=2%) maintaining a thickness of 110 nm by the plasma CVD method. The gate-insulating film is not limited to the silicon oxynitride film but may have a structure on which is laminated a single layer or plural layers of an insulating film containing silicon.

When the silicon oxide film is to be formed, TEOS (tetraethyl orthosilicate) and $O_2$ are mixed together by the plasma CVD method, and are reacted together under a reaction pressure of 40 Pa, at a substrate temperature of from 300 to 400° C., at a frequency of 13.56 MHz and a discharge electric power density of from 0.5 to 0.8 W/cm². The thus formed silicon oxide film is, then, heat-annealed at 400 to 500° C. thereby to obtain the gate-insulating film having good properties.

Then, a heat-resistant electrically conducting layer 907 is formed on the gate-insulating film 906 maintaining a thickness of from 200 to 400 nm (preferably, from 250 to 350 nm) to form the gate electrode. The heat-resistant electrically conducting layer 907 may be formed as a single layer or may, as required, be formed in a structure of laminated layers of plural layers such as two layers or three layers. The heat-resistant electrically conducting layer contains an element selected from Ta, Ti and W, or contains an alloy of the above element, or an alloy of a combination of the above elements. The heat-resistant electrically conducting layer is formed by the sputtering method or the CVD method, and should contain impurities at a decreased concentration to decrease the resistance and should, particularly, contain oxygen at a concentration of not higher than 30 ppm. In this Example, the W film is formed maintaining a thickness of 300 nm. The W film may be formed by the sputtering method by using W as a target, or may be formed by the hot CVD method by using tungsten hexafluoride ($WF_6$). In either case, it is necessary to decrease the resistance so that it can be used as the gate electrode. It is, therefore, desired that the W film has a resistivity of not larger than 20 μΩcm. The resistance of the W film can be decreased by coarsening the crystalline particles. When W contains much impurity elements such as oxygen, the crystallization is impaired and the resistance increases. When the sputtering method is employed, therefore, a W target having a purity of 99.9999% is used, and the W film is formed while giving a sufficient degree of attention so that the impurities will not be infiltrated from the gaseous phase during the formation of the film, to realize the resistivity of from 9 to 20 μΩcm.

On the other hand, the Ta film that is used as the heat-resistant electrically conducting layer 907 can similarly be formed by the sputtering method. The Ta film is formed by using Ar as a sputtering gas. Further, the addition of suitable amounts of Xe and Kr into the gas during the sputtering makes it possible to relax the internal stress of the film that is formed and to prevent the film from being peeled off. The Ta film of a phase has a resistivity of about 20 μΩcm and can be used as the gate electrode but the Ta film of β phase has a resistivity of about 180 μΩcm and is not suited for use as the gate electrode. The TaN film has a crystalline structure close to the a phase. Therefore, if the TaN film is formed under the Ta film, there is easily formed the Ta film of α-phase. Further, though not diagramed, formation of the silicon film doped with phosphorus (P) maintaining a thickness of about 2 to about 20 nm under the heat-resistant electrically conducting layer 907 is effective in fabricating the device. This helps improve the intimate adhesion of the electrically conducting film formed thereon, prevent the oxidation, and prevent trace amounts of alkali metal elements contained in the heat-resistant electrically conducting layer 907 from being diffused into the gate-insulating film 906 of the first shape. In any way, it is desired that the heat-resistant electrically conducting layer 907 has a resistivity over a range of from 10 to 50 μΩcm.

Next, a mask 908 is formed by a resist relying upon the photolithographic technology. Then, a first etching is executed. This Example uses an ICP etching device, uses $Cl_2$ and $CF_4$ as etching gases, and forms a plasma with RF (13.56 MHz) electric power of 3.2 W/cm² under a pressure of 1 Pa. The RF (13.56 MHz) electric power of 224 mW/cm² is supplied to the side of the substrate (sample stage), too, whereby a substantially negative self-bias voltage is applied. Under this condition, the W film is etched at a rate of about 100 nm/min. The first etching treatment is effected by estimating the time by which the W film is just etched relying upon this etching rate, and is conducted for a period of time which is 20% longer than the estimated etching time.

The electrically conducting layers 909 to 912 having a first tapered shape are formed by the first etching treatment. The electrically conducting layers 909 to 912 are tapered at an angle of from 15 to 30°. To execute the etching without leaving residue, over-etching is conducted by increasing the etching time by about 10 to 20%. The selection ratio of the silicon oxynitride film (gate-insulating film 906) to the W film is 2 to 4 (typically, 3). Due to the over-etching, therefore, the surface where the silicon oxynitride film is exposed is etched by about 20 to about 50 nm (FIG. 7(B)).

Then, a first doping treatment is effected to add an impurity element of a first type of electric conduction to the semiconductor layer. Here, a step is conducted to add an impurity element for imparting the n-type. A mask 908 forming the electrically conducting layer of a first shape is left, and an impurity element is added by the ion-doping method to impart the n-type in a self-aligned manner with the electrically conducting layers 909 to 912 having a first tapered shape as masks. The dosage is set to be from $1 \times 10^{13}$ to $5 \times 10^{14}$ atoms/cm² so that the impurity element for imparting the n-type reaches the underlying semiconductor layer penetrating through the tapered portion and the gate-insulating film 906 at the ends of the gate electrode, and the acceleration voltage is selected to be from 80 to 160 keV. As the impurity element for imparting the n-type, there is used an element belonging to the Group 15 and, typically, phosphorus (P) or arsenic (As). Phosphorus (P) is used, here. Due to the ion-doping method, an impurity element for imparting the n-type is added to the first impurity regions 914 to 917 over a concentration range of from $1 \times 10^{20}$ to $1 \times 10^{21}$ atoms/cm³ (FIG. 7(C)).

In this step, the impurities turn down to the lower side of the electrically conducting layers 909 to 912 of the first shape depending upon the doping conditions, and it often happens that the first impurity regions 914 to 917 are overlapped on the electrically conducting layers 909 to 912 of the first shape.

Next, the second etching treatment is conducted as shown in FIG. 7(D). The etching treatment, too, is conducted by using the ICP etching device, using a mixed gas of $CF_4$ and $Cl_2$ as an etching gas, using an RF electric power of 3.2 W/cm² (13.56 MHz), a bias power of 45 mW/cm² (13.56 MHz) under a pressure of 1.0 Pa. Under this condition, there are formed the electrically conducting layers 918 to 921 of a second shape. The end portions thereof are tapered, and the thicknesses gradually increase from the ends toward the inside. The rate of isotropic etching increases in proportion to a decrease in the bias voltage applied to the side of the substrate as compared to the first etching treatment, and the angle of the tapered portions becomes 30 to 60°. The mask 908 is ground at the edge by etching to form a mask 922. In the step of FIG. 7(D), the surface of the gate-insulating film 906 is etched by about 40 nm.

Then, the doping is effected with an impurity element for imparting the n-type under the condition of an increased acceleration voltage by decreasing the dosage to be smaller than that of the first doping treatment. For Example, the acceleration voltage is set to be from 70 to 120 keV, the dosage is set to be $1 \times 10^{13}$/cm² thereby to form first impurity regions 924 to 927 having an increased impurity concentration, and second impurity regions 928 to 931 that are in contact with the first impurity regions 924 to 927. In this step, the impurity may turn down to the lower side of the electrically conducting layers 918 to 921 of the second shape, and the second impurity regions 928 to 931 may be overlapped on the electrically conducting layers 918 to 921 of the second shape. The impurity concentration in the second impurity regions is from $1\times10^{16}$ to $1\times10^{18}$ atoms/cm$^3$ (FIG. 8(A)).

Referring to FIG. 8(B), impurity regions 933 (933a, 933b) and 934 (934a, 934b) of the conduction type opposite to the one conduction type are formed in the semiconductor layers 902, 905 that form the p-channel TFTs. In this case, too, an impurity element for imparting the p-type is added using the electrically conducting layers 918, 921 of the second shape as masks to form impurity regions in a self-aligned manner. At this moment, the semiconductor layers 903 and 904 forming the n-channel TFTs are entirely covered for their surfaces by forming a mask 932 of a resist. Here, the impurity regions 933 and 934 are formed by the ion-doping method by using diborane (B$_2$H$_6$). The impurity element for imparting the p-type is added to the impurity regions 933 and 934 at a concentration of from $2\times10^{20}$ to $2\times10^{21}$ atoms/cm$^3$.

If closely considered, however, the impurity regions 933, 934 can be divided into two regions containing an impurity element that imparts the n-type. Third impurity regions 933a and 934a contain the impurity element that imparts the n-type at a concentration of from $1\times10^{20}$ to $1\times10^{21}$ atoms/cm$^3$ and fourth impurity regions 933b and 934b contain the impurity element that imparts the n-type at a concentration of from $1\times10^{17}$ to $1\times10^{20}$ atoms/cm$^3$. In the impurity regions 933b and 934b, however, the impurity element for imparting the p-type is contained at a concentration of not smaller than $1\times10^{19}$ atoms/cm$^3$ and in the third impurity regions 933a and 934a, the impurity element for imparting the p-type is contained at a concentration which is 1.5 to 3 times as high as the concentration of the impurity element for imparting the n-type. Therefore, the third impurity regions work as source regions and drain regions of the p-channel TFTs without arousing any problem.

Referring next to FIG. 8(C), a first interlayer-insulating film 937 is formed on the electrically conducting layers 918 to 921 of the second shape and on the gate-insulating film 906. The first interlayer-insulating film 937 may be formed of a silicon oxide film, a silicon oxynitride film, a silicon nitride film, or a laminated-layer film of a combination thereof. In any case, the first interlayer-insulating film 937 is formed of an inorganic insulating material. The first interlayer-insulating film 937 has a thickness of 100 to 200 nm. When the silicon oxide film is used as the first interlayer-insulating film 937, TEOS and O$_2$ are mixed together by the plasma CVD method, and are reacted together under a pressure of 40 Pa at a substrate temperature of 300 to 400° C. while discharging the electric power at a high frequency (13.56 MHz) and at a power density of 0.5 to 0.8 W/cm$^2$. When the silicon oxynitride film is used as the first interlayer-insulating film 937, this silicon oxynitride film may be formed from SiH$_4$, N$_2$O and NH$_3$, or from SiH$_4$ and N$_2$O by the plasma CVD method. The conditions of formation in this case are a reaction pressure of from 20 to 200 Pa, a substrate temperature of from 300 to 400° C. and a high-frequency (60 MHz) power density of from 0.1 to 1.0 W/cm$^2$. As the first interlayer-insulating film 937, further, there may be used a hydrogenated silicon oxynitride film formed by using SiH$_4$, N$_2$O and H$_2$. The silicon nitride film, too, can similarly be formed by using SiH$_4$ and NH$_3$ by the plasma CVD method.

Then, a step is conducted for activating the impurity elements that impart the n-type and the p-type added at their respective concentrations. This step is conducted by thermal annealing method using an annealing furnace. There can be further employed a laser annealing method or a rapid thermal annealing method (RTA method). The thermal annealing method is conducted in a nitrogen atmosphere containing oxygen at a concentration of not higher than 1 ppm and, preferably, not higher than 0.1 ppm at from 400 to 700° C. and, typically, at from 500 to 600° C. In this Example, the heat treatment is conducted at 550° C. for 4 hours. When a plastic substrate having a low heat-resistance temperature is used as the substrate 501, it is desired to employ the laser annealing method.

Following the step of activation, the atmospheric gas is changed, and the heat treatment is conducted in an atmosphere containing 3 to 100% of hydrogen at from 300 to 450° C. for from 1 to 12 hours to hydrogenate the semiconductor layer. This step is to terminate the dangling bonds of $10^{16}$ to $10^{18}$/cm$^3$ in the semiconductor layer with hydrogen that is thermally excited. As another means of hydrogenation, the plasma hydrogenation may be executed (using hydrogen excited with plasma). In any way, it is desired that the defect density in the semiconductor layers 902 to 905 is suppressed to be not larger than $10^{16}$/cm$^3$. For this purpose, hydrogen may be added in an amount of from 0.01 to 0.1 atomic %.

Then, a second interlayer-insulating film 939 of an organic insulating material is formed maintaining an average thickness of from 1.0 to 2.0 µm. As the organic resin material, there can be used polyimide, acrylic resin, polyamide, polyimide-amide, BCB (benzocyclobutene) as well as photosensitive acrylic resin. When there is used, for example, a polyimide of the type that is heat-polymerized after being applied onto the substrate, the second interlayer-insulating film is formed being fired in a clean oven at 300° C. When there is used an acrylic resin, there is used the one of the two-can type. Namely, the main material and a curing agent are mixed together, applied onto the whole surface of the substrate by using a spinner, pre-heated by using a hot plate at 80° C. for 60 seconds, and are fired at 250° C. for 60 minutes in a clean oven to form the second interlayer-insulating film.

Thus, the second interlayer-insulating film 939 is formed by using an organic insulating material featuring good and flattened surface. Further, the organic resin material, in general, has a small dielectric constant and lowers the parasitic capacitance. The organic resin material, however, is hygroscopic and is not suited as a protection film. It is, therefore, desired that the second interlayer-insulating film is used in combination with the silicon oxide film, silicon oxynitride film or silicon nitride film formed as the first interlayer-insulating film 937.

Thereafter, the resist mask of a predetermined pattern is formed, and contact holes are formed in the semiconductor layers to reach the impurity regions serving as source regions or drain regions. The contact holes are formed by dry etching. In this case, a mixed gas of CF$_4$, O$_2$ and He is used as the etching gas to, first, etch the second interlayer-insulating film 939 of the organic resin material. Thereafter, CF$_4$ and O$_2$ are used as the etching gas to etch the first interlayer-insulating film 937. In order to further enhance the selection ratio relative to the semiconductor layer, CHF$_3$ is used as the etching gas to etch the gate-insulating film 906, thereby to form the contact holes.

Then, a wiring layer 940 formed of an electrically conducting metal film is formed by sputtering or vacuum vaporization. On the wiring layer 940 is further formed a separation layer 941 of a material which provides a large selection ratio for the wiring layer and for the etching solution during the etching. The separation layer 941 may be formed of an inorganic material such as nitride film or oxide film, or may be formed of an organic resin such as polyimide, polyamide or BCB (benzocyclobutene). Or, the separation layer 941 may be formed of a metal material.

Here, the separation layer 941 is patterned by using a mask and is, then, etched to form source wirings 942a to 945a, drain wirings 946a to 948a and separation portions 942b to 948b. In this specification, the structure formed by the separation layer and the wiring is called partitioning wall. Further, though not diagramed in this Example, the wiring is formed by a laminate of a 50 nm-thick Ti film and a 500 nm-thick alloy film (alloy film of Al and Ti).

Figure 9B:
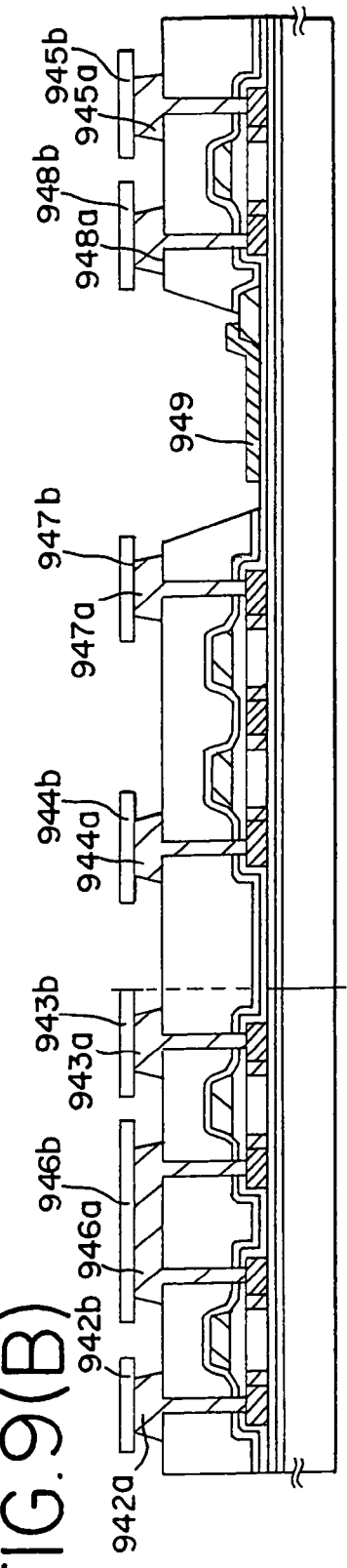

Then, a transparent electrically conducting film is formed thereon maintaining a thickness of 80 to 120 nm, and is patterned to form a pixel electrode 949 (FIG. 9(B)). In this Example, the pixel electrode 949 works as the anode. Therefore, the pixel electrode 949 is formed by using an indium oxide-tin (ITO) film or a transparent electrically conducting film obtained by mixing 2 to 20% of a zinc oxide (ZnO) into indium oxide.

Further, the pixel electrode 949 is formed being in contact with, and overlapped on, the contact wiring 923 that is electrically connected to the drain wiring 946a, so that the pixel electrode 949 is electrically connected with the drain region of the current control TFT 963.

Referring next to FIG. 9(B), an organic compound layer 950, a cathode 951 which is an opposing electrode and a passivation film 952 are formed by the evaporation method. It is here desired that the pixel electrode 947 is heat-treated to completely remove the water content prior to forming the organic compound layer 950. In this Example, an electrode formed of a Mg:Ag alloy is used as the cathode of the light-emitting element, though any other material may be used, as a matter of course.

The organic compound layer 950 is formed by laminating plural layers such as a positive hole injection layer, a positive hole transporting layer, an electron transporting layer, an electron injection layer and a buffer layer in addition to the light-emitting layer. The structure of the organic compound layer 950 used in this Example will now be described in detail.

In this Example, the positive hole injection layer is formed by depositing copper phthalocyanine, and the positive hole transporting layer is formed by depositing MTDATA (4,4',4'-tris(3-methylphenylphenylamino)triphenylamine) by the evaporation method. It is, however, also allowable to use a PEDOT which is a polythiophene derivative as the positive hole injection layer, and an α-NPD or a polyphenylenevinylene (PPV) as the positive hole transporting layer.

Next, a light-emitting layer is formed. In this Example, organic compound layers that emit different light are formed by using different materials for the light-emitting layers. In this Example, organic compound layers are formed to emit light of red, green and blue colors.

The light-emitting layer that emits light of red color is formed by doping $Alq_3$ with DCM. There can be further used an Eu complex ($Eu(DCM)_3(Phen)$) and aluminum quinolylato complex ($Alq_3$) doped with DCM-1, as well as any other known material.

The light-emitting layer that emits light of green color is formed by depositing CBP and $Ir(ppy)_3$ together. There can be further used an aluminum quinolylato complex ($Alq_3$) and benzoquinolynolatoberyllium complex (BeBq). There can be further used the aluminum quinolylato complex ($Alq_3$) being doped with cumarin 6 or quinacridone, as well as any other known material.

As the light-emitting layer that emits light of blue color, there can be used DPVBi which is a distyryl derivative or a zinc complex having an azomethine compound as a ligand and the DPVBi doped with perylene, as well as any other known material.

After the light-emitting layer is formed, further, there may be formed the electron transporting layer and the electron injection layer. In this embodiment, a material such as 1,3,4-oxadiazole derivative or 1,2,4-triazolederivative (TAZ) is used as the electron transporting layer. Further, a buffer layer 206 may be formed by using such a material as lithium fluoride (LiF), aluminum oxide ($Al_2O_3$) or lithiumacetyl acetonate (Liacac).

The organic compound layer 950 having the laminated-layer structure may have a thickness of from 10 to 400 [nm] (typically, from 60 to 150 [nm]), and the cathode 951 may have a thickness of from 80 to 200 [nm] (typically, from 100 to 150 [nm]).

After the organic compound layer 950 is formed, the cathode 951 is formed by the vaporization method to complete the light-emitting element 954. In this Example, the Mg:Ag alloy is used as the electrically conducting film that serves as the cathode 951 of the light-emitting element 954. It is, however, also allowable to form an Al—Li alloy film (alloy film of aluminum and lithium) or a film formed by covaporizing aluminum and an element belonging to the Group 1 or the Group 2 of periodic table. The covaporization stands for the vaporization method by which the cells for being vaporized are heated together and different substances are mixed together in the step of forming the film.

After the cathode 951 has been formed, a passivation film 952 is formed. Upon forming the passivation film 952, the organic compound layer 950 and the cathode 951 can be protected from the water component and oxygen. In this Example, a silicon nitride film is formed maintaining a thickness of 300 nm as the passivation film 952. After the cathode 951 is formed, the passivation film 952 may be continuously formed without being exposed to the open air.

Figure 9C:
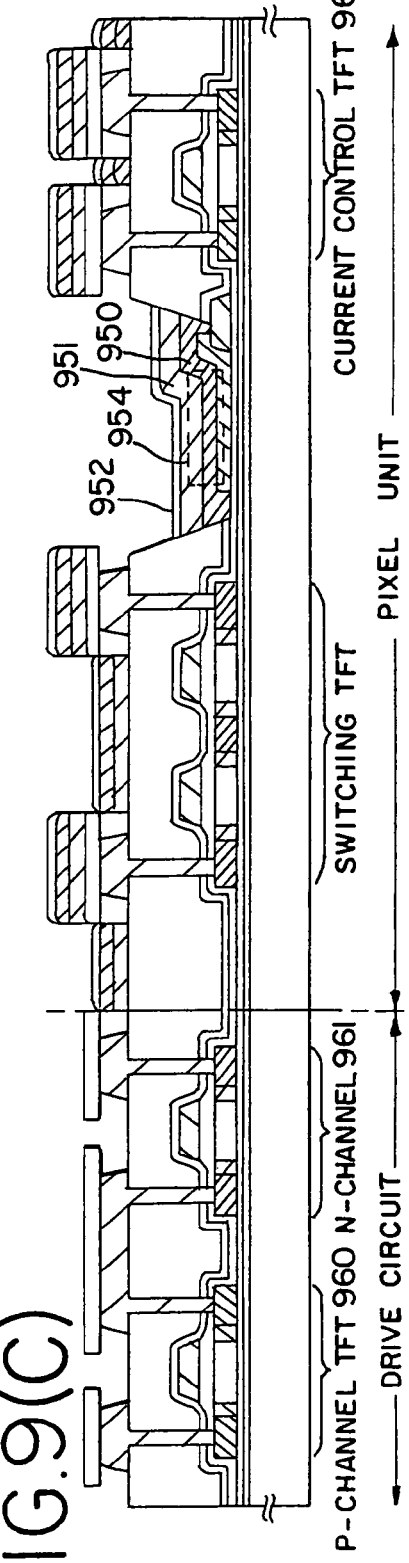

Thus, the light-emitting device of the structure shown in FIG. 9(C) is completed. A portion where the pixel electrode 949, the organic compound layer 950 and the cathode 951 are overlapped one upon the other, corresponds to the light-emitting element 954.

The p-channel TFT 960 and the n-channel TFT 961 are the TFTs possessed by the drive circuit, and are forming a CMOS. The switching TFT 962 and the current control TFT 963 are the TFTs possessed by the pixel unit. The TFTs of the drive circuit and the TFTs of the pixel unit can be formed on the same substrate.

In the case of the light-emitting device using the light-emitting element, the power source voltage of the drive circuit is about 5 to about 6 V, and is about 10 V at the greatest. Therefore, the TFTs are not much deteriorated by hot electrons. Further, since the drive circuit needs to be operated at a high speed, it is desired that the gate capacity of the TFT is better small. In the drive circuit for the light-emitting device using light-emitting elements as in this Example, therefore, it is desired that the second impurity region 929 and the fourth impurity region 933b possessed by the semiconductor layer of the TFT are not overlapped on the gate electrodes 918 and 919.

Thus, there is formed a light-emitting panel forming the light-emitting elements on the substrate as shown in FIG. 9(C).

The thus formed light-emitting panel is then sealed and is electrically connected to an external power source through an FPC to complete the light-emitting device of the invention.

Example 2

This Example deals in detail with reference to FIG. 10 the method of completing, as the light-emitting device, the light-emitting panel fabricated up to FIG. 9(C) in Example 1.

FIG. 10(A) is a top view illustrating a state where the light-emitting element is sealed, and FIG. 10(B) is a sectional view of when FIG. 10(A) is cut along the line A-A'. A dotted line 1001 denotes a drive circuit of the source side, 1002 denotes a pixel unit, and 1003 denotes a drive circuit of the gate side. Reference numeral 1004 denotes a covering member, 1005 denotes a sealing agent, and space 1007 is formed on the inside surrounded by the sealing agent 1005.

Reference numeral 1008 denotes a wiring for transmitting the signals input to the drive circuit 1001 of the source side and to the drive circuit 1003 of the gate side, and video signals and clock signals are received through an FPC (flexible printed circuit) that serves as an external input terminal. Though the FPC only is diagramed here, a printed wiring board (PWB) may be mounted on the FPC. In this specification, the light-emitting device includes not only the light-emitting module of a state of mounting the FPC or the PWB on the light-emitting panel but also the light-emitting module mounting an IC.

Next, the sectional structure will be described with reference to FIG. 10(B). The pixel unit 1002 and the drive circuit 1003 on the gate side are formed on the substrate 1000, the pixel unit 1002 being constituted by current control TFTs 1011 and plural pixels containing transparent electrodes 1012 electrically connected to the drains of the current control TFTs 1011. Further, the drive circuit 1003 of the gate side is constituted by the CMOS circuit of a combination of the n-channel TFTs 1013 and the p-channel TFTs 1014 (see FIG. 9).

The pixel electrode 1012 serves as the anode of the light-emitting element. Interlayer-insulating films 1006 are formed at both ends of the pixel electrode 1012. On the pixel electrode 1012 are formed an organic compound layer 1016 and a cathode 1017 which is an opposing electrode of the light-emitting element.

The cathode 1017 also works as a wiring common to plural pixels, and is electrically connected to the FPC 1010 through the connection wiring 1009. The elements included in the pixel unit 1002 and in the drive circuit 1003 of the gate side are all covered with the passivation film 1018.

The covering member 1004 is stuck with the sealing agent 1005. There maybe provided a spacer of a plastic film to secure a gap between the covering member 1004 and the light-emitting element. Closed space is defined on the inside of the sealing agent 1005, and is filled with an inert gas such as nitrogen or argon gas. A hygroscopic member as represented by barium oxide may be provided in the sealed space.

As the covering member 1004, there can be used a glass, ceramics, plastics or a metal. Here, however, the covering member 1004 must be capable of transmitting light when light is to be emitted on the side of the covering member 1004. As the plastics, there can be used FRP (fiberglass-reinforced plastics), PVF (polyvinyl fluoride), Mylar, polyester or acrylic resin.

As described above, the light-emitting panel is sealed by using the covering member 1004 and the sealing agent 1005, in order to completely shut the light-emitting elements off the external side and to prevent, from the external side, the infiltration of substances such as water and oxygen that deteriorate the organic compound layer upon the oxidation. It is therefore allowed to obtain a highly reliable light-emitting device.

This Example can be put into practice in free combination with Example 1.

Example 3

Figure 11A:
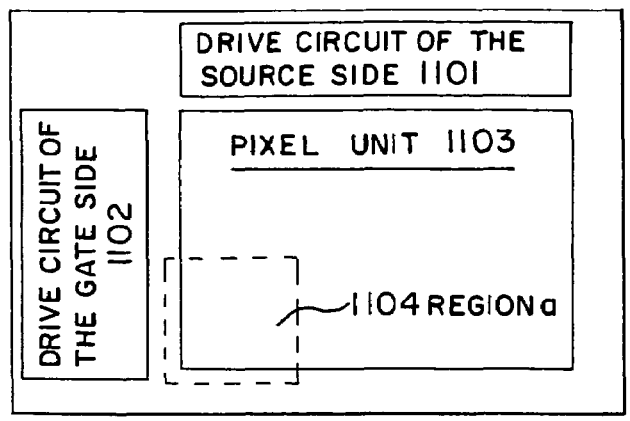
FIG. 11(A) is a view illustrating a pixel unit and a driver.

FIG. 11 is a top view of the pixel unit of the light-emitting element fabricated according to the method of Example 1. The circuit constitution on the substrate is as shown in FIG. 11(A); i.e., there are arranged a drive circuit 1101 of the source side, a drive circuit 1102 of the gate side and a pixel unit 1103.

Figure 11B:
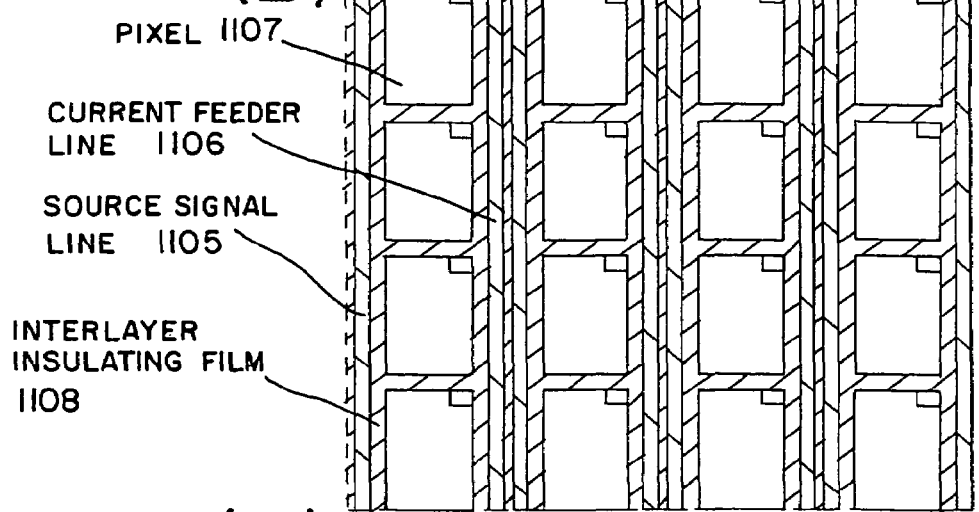
FIG. 11(B) is a top view illustrating a part of a pixel unit.

FIG. 11(B) is a diagram illustrating, on an enlarged scale, a region a (1104) of the pixel unit 1103 in which are formed pixel electrodes (anodes in this Example) of the light-emitting elements and the organic compound layer.

The source signal line 1105 is electrically connected to the drive circuit 1101 of the source side. The current feeder line 1106 for supplying the current to the light-emitting element is formed in parallel with the source signal line 1105.

Pixels 1107 formed in a plural number in the form of a matrix in the pixel unit 1103 are each surrounded by the interlayer-insulating film 1108.

Figure 11C:
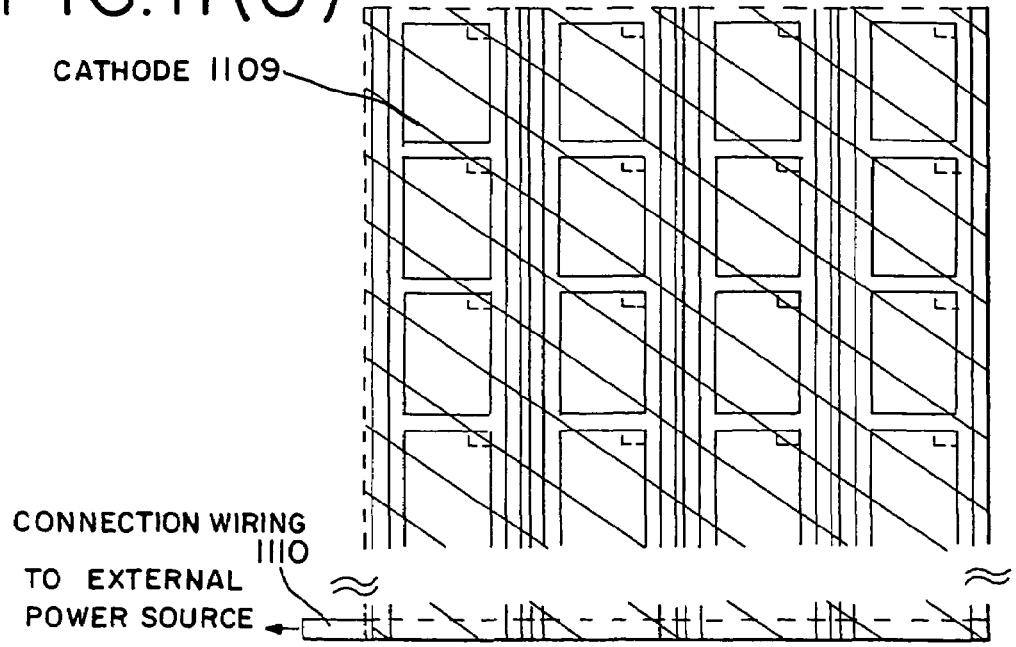
FIG. 11(C) is a top view illustrating a part of a pixel unit.

After the organic compound layer has been formed, a cathode 1109 which is an opposing electrode is formed as shown in FIG. 11(C). Here, however, the source signal line 1105 and the current feeder line 1106 formed on the interlayer-insulating film 1108 are located at positions higher than the surface of the substrate as compared to the pixels 1107 and, hence, the cathode 1109 is cut off. That is, the cathode 1109 is common to the same sequence of pixels arranged in the longitudinal direction facing the surface of the paper, but is not common to the sequence of pixels arranged in the transverse direction.

As shown in FIG. 11(C), therefore, the connection wiring 1110 is formed. The connection wiring 1110 has been formed already simultaneously with the electrode wiring and the gate electrode. Upon electrically connecting the cathode 1109 which serves as a wiring common to plural pixels to the connection wiring 1110 on the interlayer-insulating film 1108 through the connection portion shown in FIG. 11(C), therefore, all pixels are connected to the external power source. The connection wiring 1110 may be formed at the lower portion of the pixel unit facing the surface of the paper as shown in FIG. 11(C) or may be formed in the upper portion. Or, the connection wirings 1110 may be formed at the upper and lower portions. These structures help prevent linear defect caused by the breakage of the cathode 1109 shared by the sequence of pixels. This Example can be put into practice in free combination with the constitution of Example 1 or Example 2.

Example 4

An external light emitting quantum efficiency can be remarkably improved by using an organic material (which is also referred to as triplet compounds) by which phosphorescence from a triplet exciton can be employed for emitting a light. As a result, the power consumption of the light-emitting element can be reduced, the lifetime of the light-emitting element can be elongated and the weight of the light-emitting element can be lightened.

The following is a report where the external light emitting quantum efficiency is improved by using the triplet exciton (T. Tsutsui, C. Adachi, S. Saito, Photochemical processes in Organized Molecular Systems, ed. K. Honda, (Elsevier Sci. Pub., Tokyo, 1991) p. 437).

The molecular formula of an organic material (coumarin pigment) reported by the above article is represented as follows.

[Chemical Formula 1]

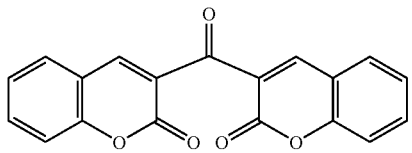

(M. A. Baldo, D.F.O' Brien, Y. You, A. Shoustikov, S. Sibley, M. E. Thompson, S. R. Forrest, Nature 395 (1998) p.151)

The molecular formula of an organic material (Pt complex) reported by the above article is represented as follows.

[Chemical Formula 2]

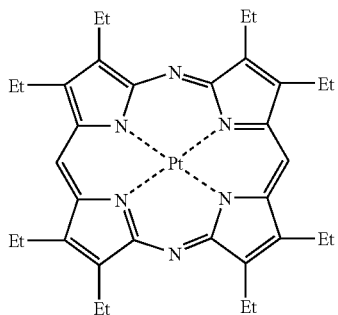

(M. A. Baldo, S. Lamansky, P. E. Burrows, M. E. Thompson, S. R. Forrest, Appl. Phys. Lett., 75 (1999) p.4.)

(T. Tsutsui, M. -J. Yang, M. Yahiro, K. Nakamura, T. Watanabe, T. Tsuji, Y. Fukuda, T. Wakimoto, S. Mayaguchi, Jpn, Appl. Phys., 38 (12B) (1999) L1502)

The molecular formula of an organic material (Ir complex) reported by the above article is represented as follows.

[Chemical Formula 3]

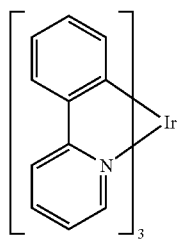

As described above, if phosphorescence from a triplet exciton can be put to practical use, it can realize the external light emitting quantum efficiency three to four times as high as that in the case of using fluorescence from a singlet exciton in principle.

Further, it is possible that the organic material of this embodiment is used to the organic compound layer of the light-emitting device shown in Embodiments 1 to 3.

Example 5

The light-emitting device fabricated in accordance with the present invention is of the self-emission type, and thus exhibits more excellent recognizability of the displayed image in a light place as compared to the liquid crystal display device. Furthermore, the light-emitting device has a wider viewing angle. Accordingly, various electronic devices can be completed by using the light-emitting device of the present invention to a display portion.

Such electronic devices include a video camera, a digital camera, a goggles-type display (head mount display), a navigation system, a sound reproduction device (a car audio equipment and an audio set), a laptop personal computer, a game machine, a portable information terminal (a mobile computer, a portable telephone, a portable game machine, an electronic book, or the like), an image reproduction apparatus including a recording medium (more specifically, an apparatus which can reproduce a recording medium such as a digital video disc (DVD) and so forth, and includes a display for displaying the reproduced image), or the like. In particular, in the case of the portable information terminal, use of the self-emission device is preferable, since the portable information terminal that is likely to be viewed from a tilted direction is often required to have a wide viewing angle. FIG. 12 respectively shows various specific examples of such electronic devices.

FIG. 12A illustrates a display device which includes a frame 2001, a support table 2002, a display portion 2003, a speaker portion 2004, a video input terminal 2005 or the like. The display device can be completed by using the light-emitting device manufactured by the present invention to the display portion 2003. The light-emitting device is of the self-emission type and therefore requires no back light. Thus, the display portion thereof can have a thickness thinner than that of the liquid crystal display device. The display device is including all of the display device for displaying information, such as a personal computer, a receiver of TV broadcasting and an advertising display.

FIG. 12B illustrated a digital still camera which includes a main body 2101, a display portion 2102, an image receiving portion 2103, an operation key 2104, an external connection port 2105, a shutter 2106, or the like. The digital still camera manufactured by the present invention can be completed by using the light-emitting device to the display portion 2102.

FIG. 12C illustrates a laptop type personal computer which includes a main body 2201, a casing 2202, a display portion 2203, a keyboard 2204, an external connection port 2205, a pointing mouse 2206, or the like. The laptop type personal computer can be completed by using the light-emitting device manufactured by the present invention to the display portion 2203.

FIG. 12D illustrated a mobile computer which includes a main body 2301, a display portion 2302, a switch 2303, an operation key 2304, an infrared port 2305, or the like. The mobile computer can be completed by using the light-emitting device to the display portion 2302.

FIG. 12E illustrates an image reproduction apparatus including a recording medium (more specifically, a DVD reproduction apparatus), which includes a main body 2401, a casing 2402, a display portion A 2403, another display portion B 2404, a recording medium (DVD or the like) reading portion 2405, an operation key 2406, a speaker portion 2407 or the like. The display portion A 2403 is used mainly for displaying image information, while the display portion B 2404 is used mainly for displaying character information. The image reproduction apparatus can be completed by using the light-emitting device manufactured by the present invention to the display portion A 2403 and B 2404. The image reproduction apparatus including a recording medium further includes a game machine or the like.

FIG. 12F illustrates a goggle type display (head mounted display) which includes a main body 2501, a display portion 2502, an arm portion 2503. The light-emitting device in accordance with the present invention can be used as the display portion 2502.

FIG. 12G illustrates a video camera which includes a main body 2601, a display portion 2602, an audio input portion 2603, an external connecting port 2604, a remote control receiving portion 2605, an image receiving portion 2606, a battery 2607, a sound input portion 2608, an operation key 2609, or the like. The video camera can be completed by using the light-emitting device manufactured by the present invention to the display portion 2602.

FIG. 12H illustrates a mobile phone which includes a main body 2701, a casing 2702, a display portion 2703, a sound input portion 2704, a sound output portion 2705, an operation key 2706, an external connecting port 2707, an antenna 2708, or the like. The mobile phone can be completed by using the light-emitting device manufactured by the present invention to the display portion 2703. Note that the display portion 2703 can reduce power consumption of the portable telephone by displaying white-colored characters on a black-colored background.

When the brighter luminance of the organic material becomes available in the future, the light-emitting device in accordance with the present invention will be applicable to a front-type or rear-type projector in which light including output image information is enlarged by means of lenses or the like to be projected.

The aforementioned electronic devices are more likely to be used for display information distributed through a telecommunication path such as Internet, a CATV (cable television system), and in particular likely to display moving picture information. The light-emitting device is suitable for displaying moving pictures since the organic material can exhibit high response speed.

A portion of the light-emitting device that is emitting light consumes power, so it is desirable to display information in such a manner that the light-emitting portion therein becomes as small as possible. Accordingly, when the light-emitting device is applied to a display portion which mainly displays character information, e.g., a display portion of a portable information terminal, and more particular, a portable telephone or a sound reproduction device, it is desirable to drive the light-emitting device so that the character information is formed by a light-emitting portion while a non-emission portion corresponds to the background.

As set forth above, the light-emitting device formed by using the present invention can be applied variously to a wide range of electronic devices in all fields. The electronic device in the present embodiment can be completed by using a light-emitting device shown in Embodiments 1 through 3 to the display portion.

According to this invention as described above, a function is imparted by utilizing the shape of the wiring to substitute for the bank that has heretofore been formed by using a mask. Further, the shape of the wiring helps solve the problem of short-circuit between the wiring and the opposing electrode. The invention, therefore, makes it possible to simplify the process for producing the light-emitting device and to produce the devices maintaining a throughput higher than ever before.

The invention claimed is:

1. A method of fabricating a display device comprising:
   forming a source region, a drain region and a channel region over a substrate;
   forming a gate insulating film over the source region, the drain region and the channel region;
   forming a gate electrode and a first wiring;
   forming an insulating film over the gate electrode and over the first wiring;
   removing a part of the insulating film formed over the first wiring;
   forming a metal film over the first wiring and over the insulating film;
   forming a separation film over the metal film;
   etching the separation film to form a separation portion;
   etching the metal film to form a second wiring after forming the separation portion, wherein the second wiring is electrically connected to one of the source region and the drain region; and
   forming a light-emitting element electrically connected to the first wiring.

2. A method of fabricating a display device according to claim 1, wherein the display device is incorporated into an electronic apparatus selected from the group consisting of a digital camera, a notebook-type personal computer, a mobile computer, a portable image-reproducing device equipped with a recording medium, a goggle-type display, a video camera, a portable telephone, a navigation system, a sound reproduction device and a game machine.

3. A method of fabricating a display device according to claim 1, wherein the separation portion comprises a material that provides an etching rate smaller than that of a material forming the second wiring with respect to an etching solution selected from the group consisting of a hydrofluoric acid, a mixed solution containing a hydrofluoric acid, and a mixed solution of phosphoric acid, nitric acid and acetic acid.

4. A method of fabricating a display device according to claim 1, wherein the separation portion comprises a material selected from the group consisting of an inorganic material, a metal and an organic resin.

5. A method of fabricating a display device according to claim 1, wherein the source region, the drain region and the channel region are a source region, a drain region and a channel region of a current control TFT.

6. A method of fabricating a display device according to claim 1, wherein the light-emitting element comprises an organic compound.

7. A method of fabricating a display device according to claim 1, wherein the first wiring is an electrode connection wiring.

8. A method of fabricating a display device according to claim 1, wherein the second wiring is a drain wiring.

9. A method of fabricating a display device according to claim 1, wherein the first wiring is in contact with the light-emitting element.

* * * * *